(12) United States Patent
Omoto

(10) Patent No.: US 8,304,777 B2
(45) Date of Patent: Nov. 6, 2012

(54) DISPLAY APPARATUS, METHOD OF MANUFACTURING DISPLAY APPARATUS, AND ELECTRONIC APPARATUS

(75) Inventor: Keisuke Omoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/069,664

(22) Filed: Mar. 23, 2011

(65) Prior Publication Data

US 2011/0241001 A1      Oct. 6, 2011

(30) Foreign Application Priority Data

Mar. 30, 2010   (JP) ................................ 2010-079014

(51) Int. Cl.
*E01L 27/15*     (2006.01)
(52) U.S. Cl. ............... 257/59; 257/40; 257/88; 257/98; 257/99; 257/100; 257/103; 257/E27.121; 257/E33.053
(58) Field of Classification Search ................. 257/40, 257/59, 88, 98, 99, 100, 103
See application file for complete search history.

(56) References Cited

FOREIGN PATENT DOCUMENTS

JP      2008-310127      12/2008

*Primary Examiner* — Long Pham
(74) *Attorney, Agent, or Firm* — Wolf, Greenfield & Sacks, P.C.

(57) ABSTRACT

A display apparatus includes a plurality of pixels each including an electro-optic element, a writing transistor writing a video signal into the pixel, a holding capacitor holding the video signal written by the writing transistor, and a driving transistor driving the electro-optic element based on the video signal held in the holding capacitor. The driving transistor includes a channel region, a gate electrode disposed opposite to the channel region, a first source/drain region closer to a power source, a second source/drain region closer to the electro-optic element, and impurity regions disposed between the channel region and the first and second source/drain regions and having a lower concentration than that of the corresponding source/drain region. The impurity region disposed between the channel region and the first source/drain region is formed in a region other than a region facing the gate electrode.

4 Claims, 20 Drawing Sheets

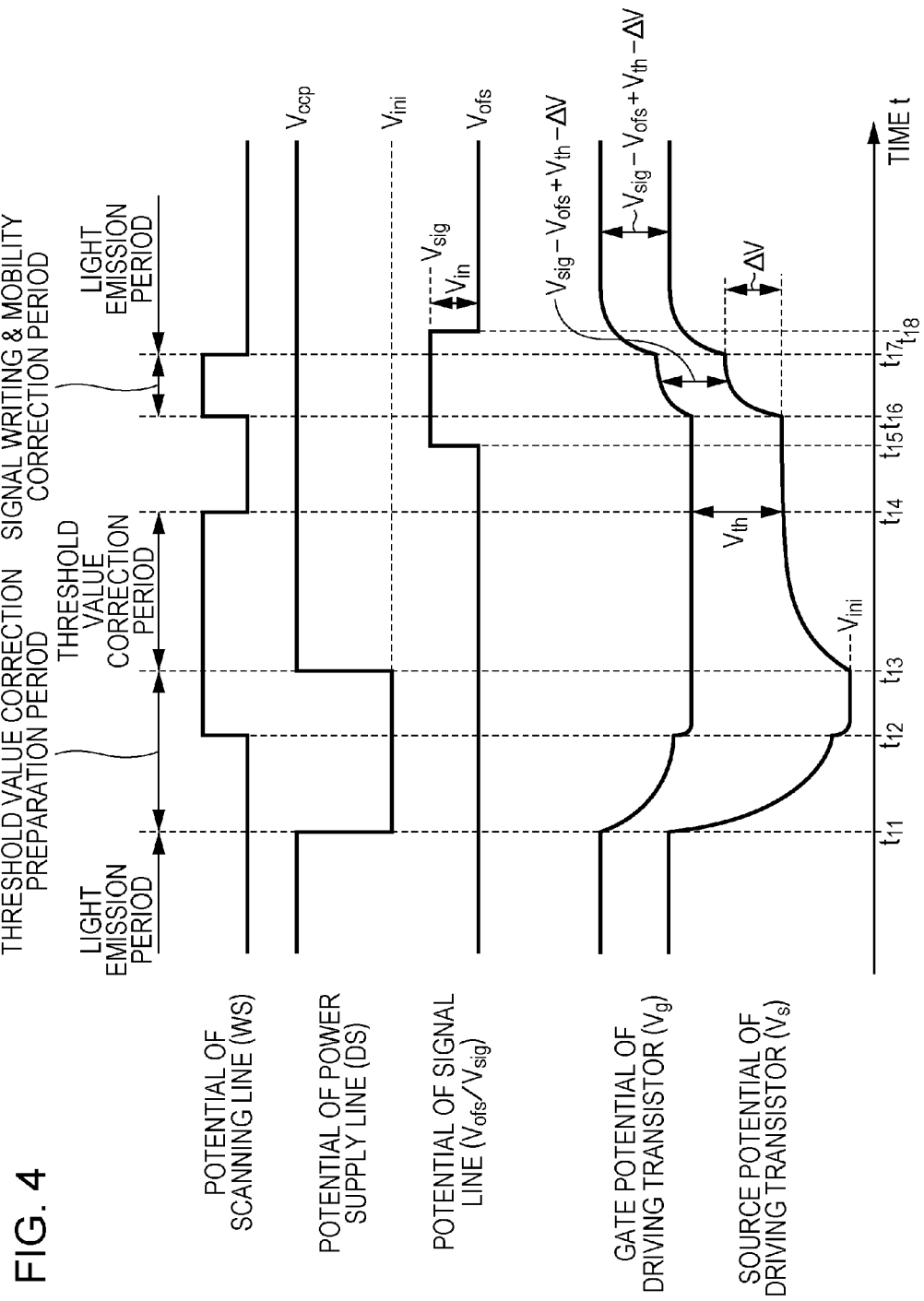

BEFORE t=$t_{11}$ t=$t_{11}$ t=$t_{12}$ t=$t_{13}$

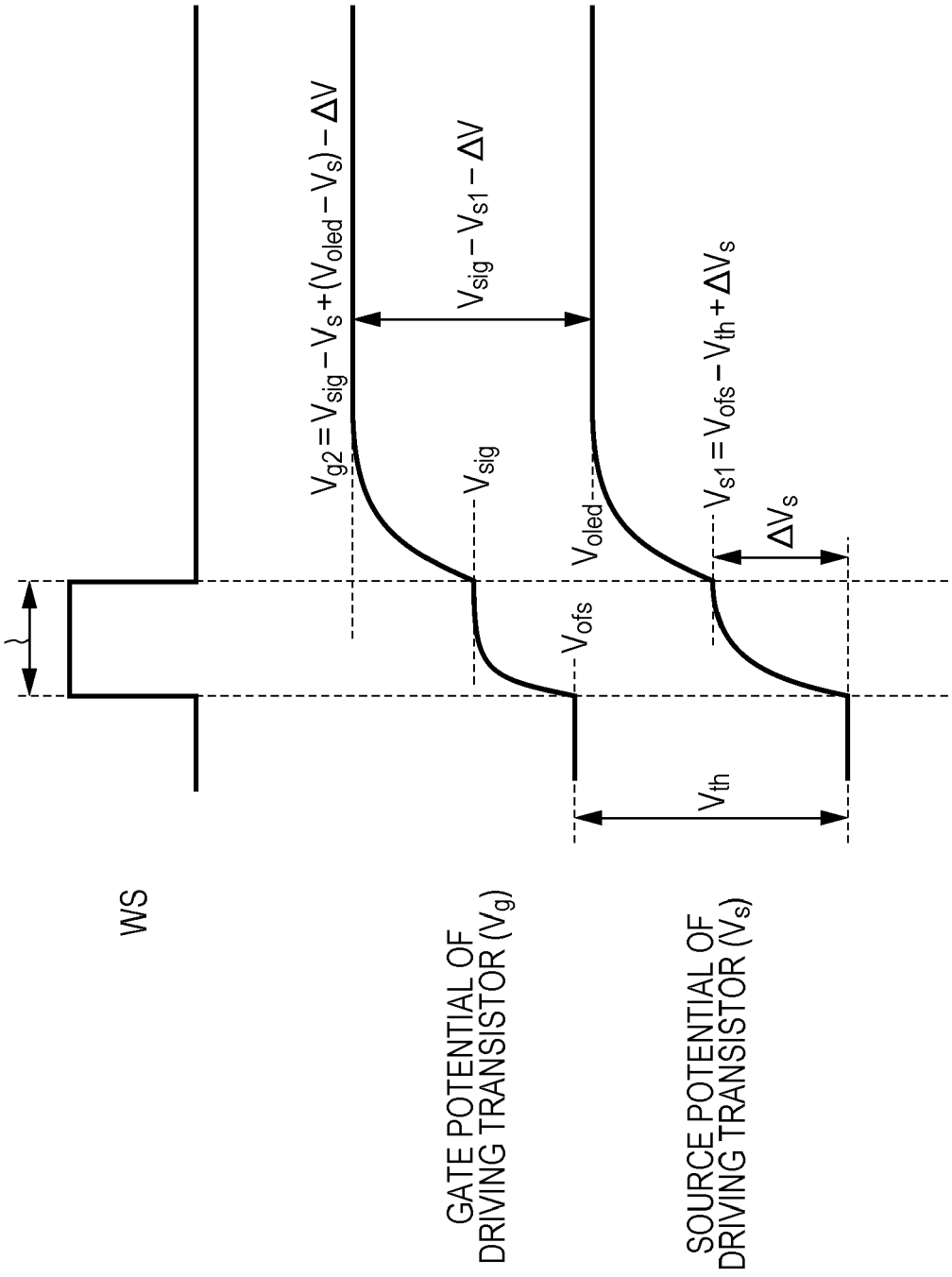

WHEN $V_g$, $V_s$ BEFORE BOOTSTRAP IS SET TO $V_{g1}$, $V_{s1}$
$V_g$, $V_s$ AFTER BOOTSTRAP IS SET TO $V_{g2}$, $V_{s2}$ $$(C_{gd}+C_{ws})(V_{g1}-V_{g2})+(C_s+C_{gs})\{(V_{g1}-V_{s1})-(V_{g2}-V_{s1})\}=0$$
$$(C_{gd}+C_{ws}+C_s+C_{gs})(V_{g2}-V_{g1})=(C_s+C_{gs})(V_{s2}-V_{s1})$$
$$\therefore V_{g2}-V_{g1}=G_b(V_{s2}-V_{s1})$$
$$G_b=\frac{(C_s+C_{gs})}{(C_{gd}+C_{ws}+C_s+C_{gs})}$$

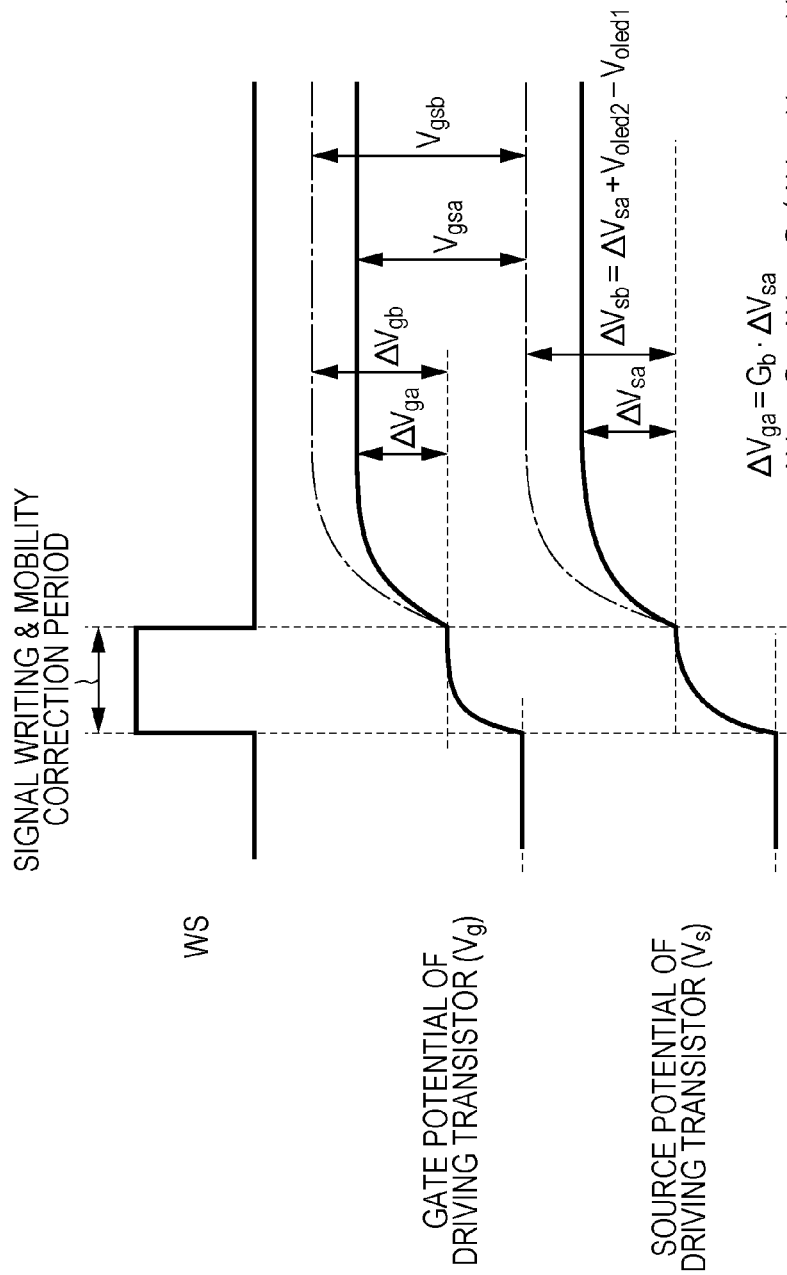

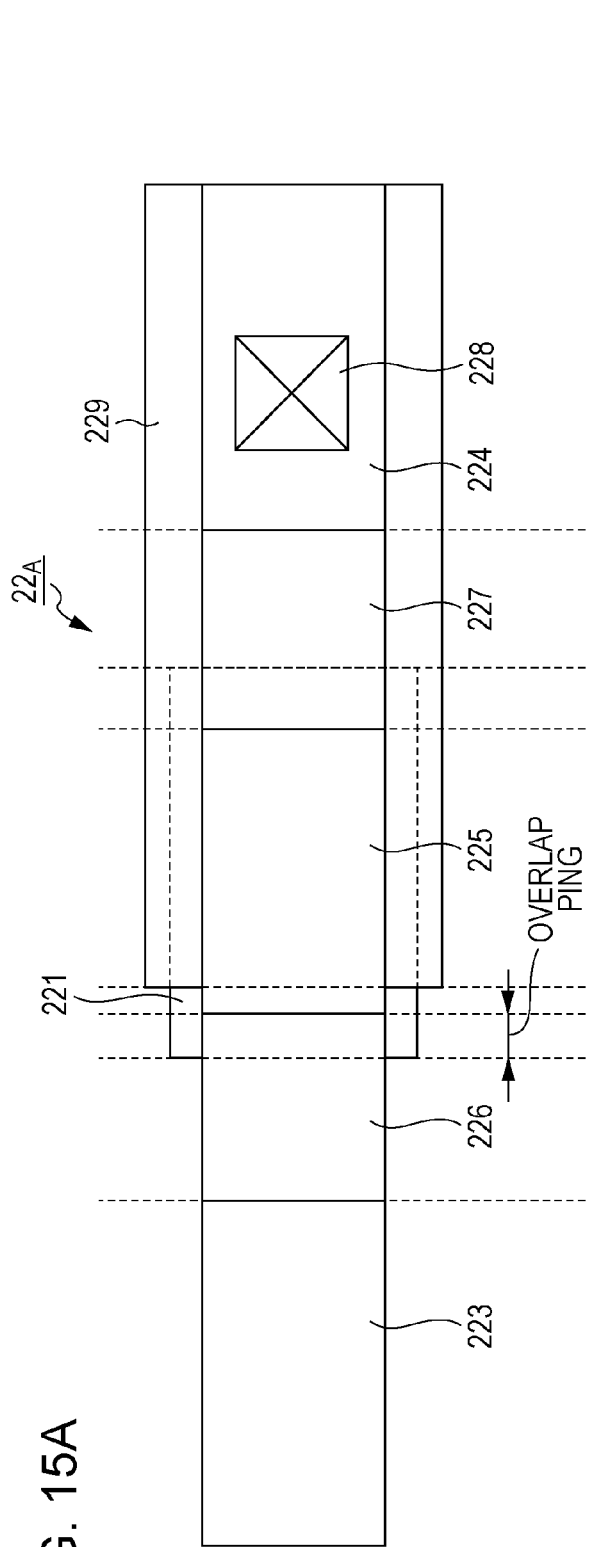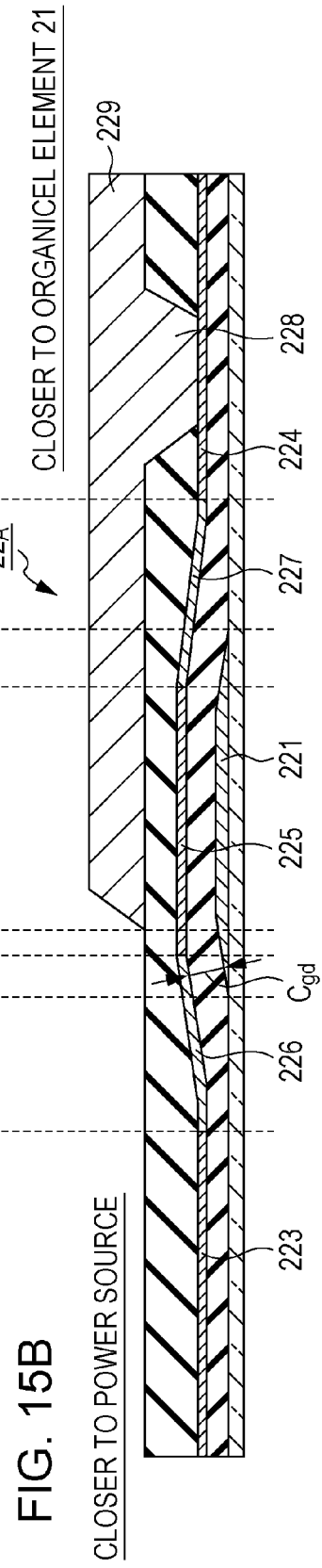
FIG. 15A
FIG. 15B

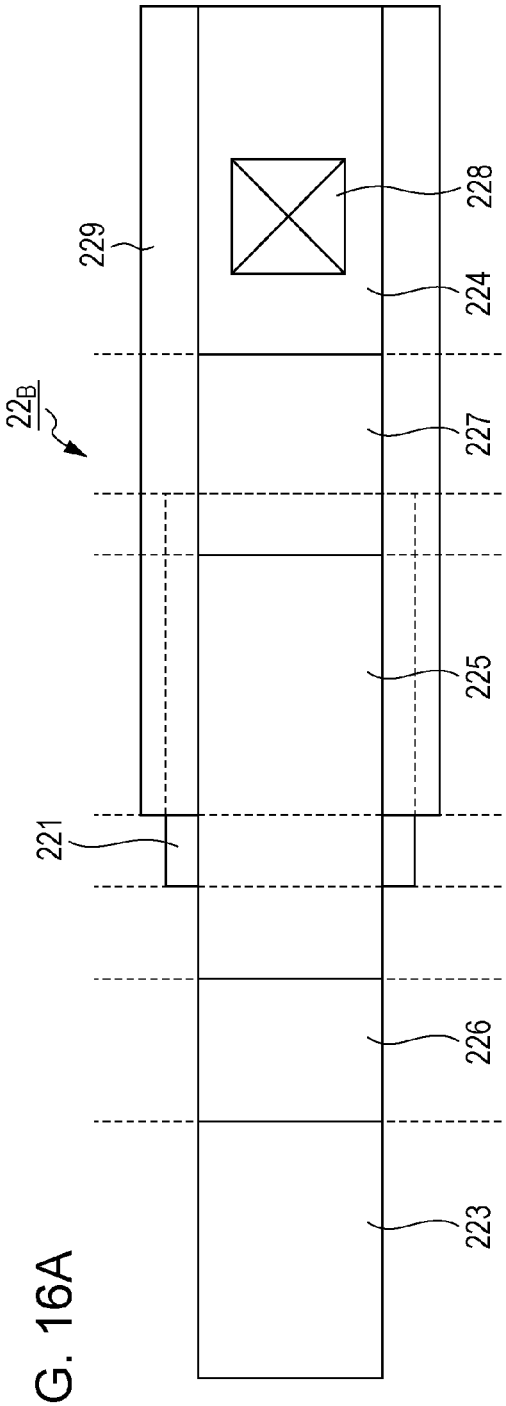
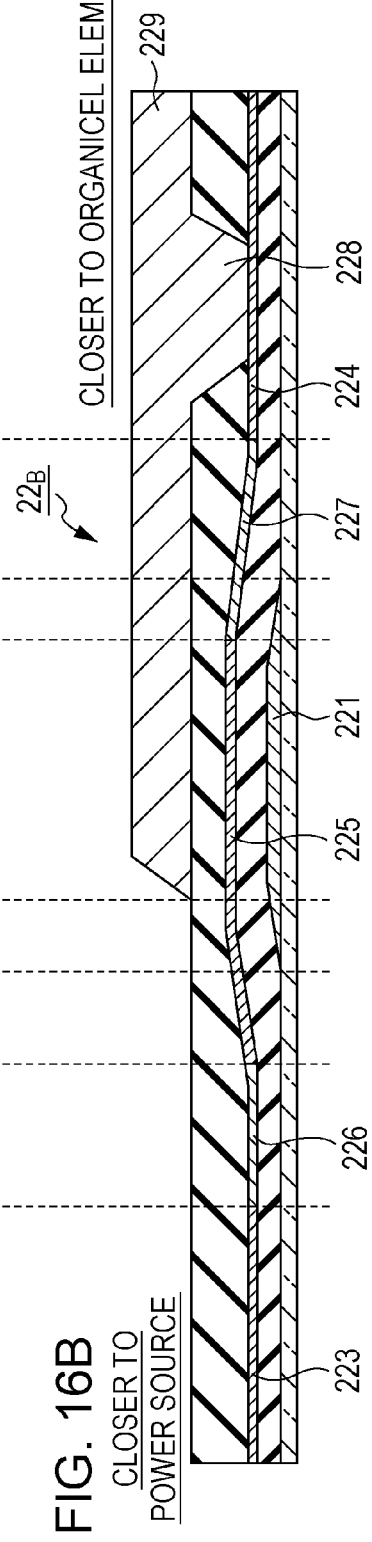
FIG. 16A
FIG. 16B

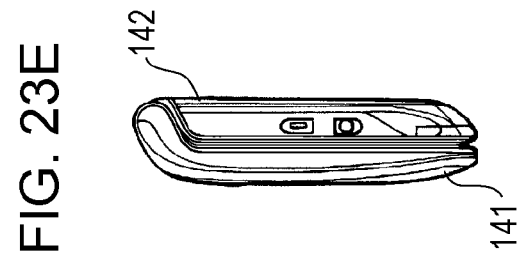
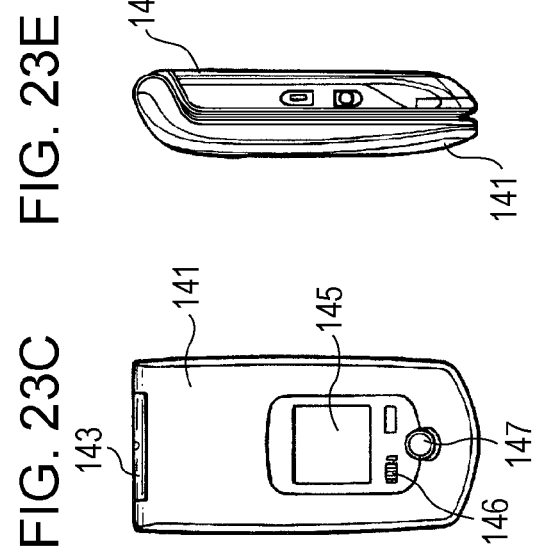
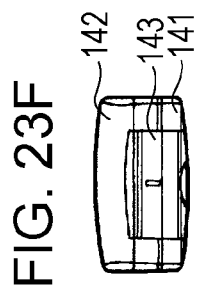
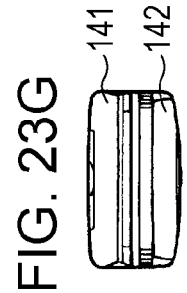
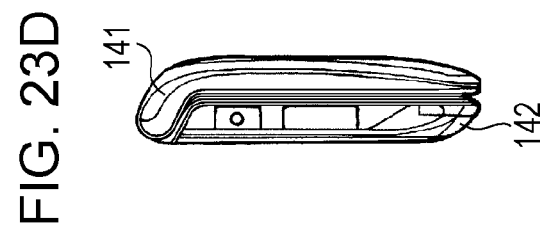
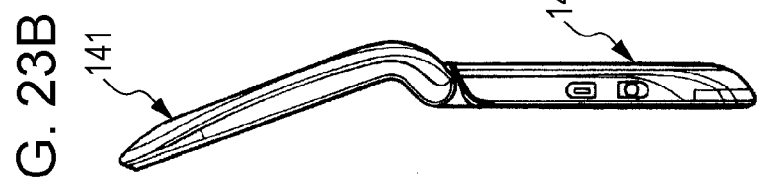
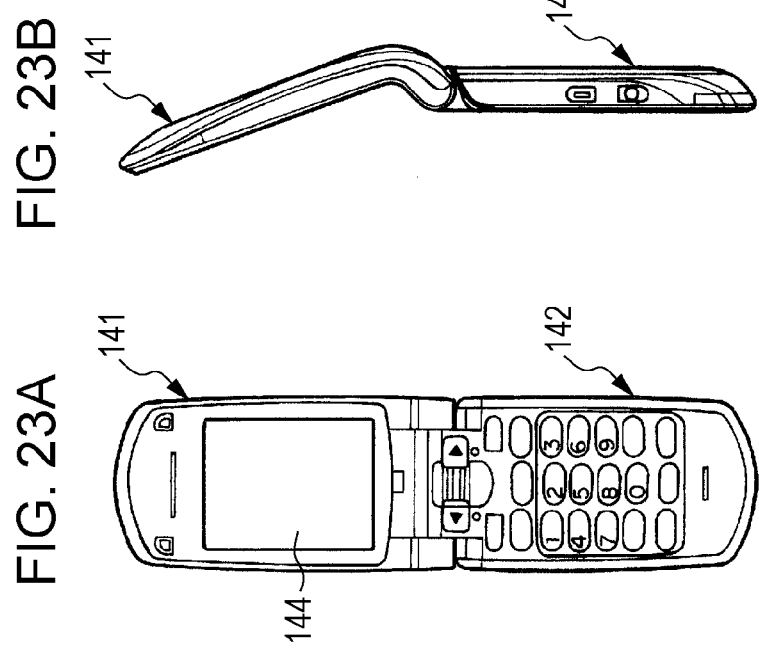

DISPLAY APPARATUS, METHOD OF MANUFACTURING DISPLAY APPARATUS, AND ELECTRONIC APPARATUS

BACKGROUND OF THE INVENTION

1. Field of the Invention

The present invention relates to a display apparatus, a method of manufacturing the display apparatus, and an electronic apparatus, and more particularly, to a display apparatus in which pixels including an electro-optic element are arranged two-dimensionally in a matrix form, a method of manufacturing the display apparatus, and an electronic apparatus including the display apparatus.

2. Description of the Related Art

In recent years, in the field of display apparatuses displaying an image, flat type display apparatuses in which pixels (pixel circuits) are arranged in a matrix form have rapidly come into wide use. As one of the flat type display apparatuses, there is known a display apparatus in which a so-called current-driven-type electro-optic element, in which light emission luminance varies according to the value of current flowing in a device, is used as a light-emitting element. As the current-driven-type electro-optic element, there is known an organic EL element which uses the phenomenon in which light is emitted when an electric field is applied to the organic thin film using electro-luminescence (EL) of an organic material.

An organic EL display apparatus using the organic EL element as a light-emitting element of the pixel has the following features. That is, the organic EL element consumes less power since the organic EL element can be driven with an applied voltage of 10 V or less. The organic EL element has high image visibility compared to a liquid crystal display apparatus, since the organic EL element is a self-luminous element. Moreover, since an illumination member such as a backlight member is not necessary, lightness and thinness can be realized easily. Furthermore, since the organic EL element has a high response speed of about several μsec, afterimages rarely occur when a video is displayed.

As a driving method of the organic EL display apparatus, there are a simple (passive) matrix type and an active matrix type, like a liquid crystal display apparatus. The simple matrix type display apparatus has a simple configuration. However, a problem may arise in that it is difficult to realize a large-scale and high precision display apparatus since a light emission period of an electro-optic element becomes shorter with an increase in the number of scanning lines (that is, the number of pixels).

Therefore, in recent years, an active matrix type display apparatus has actively been developed in which current flowing in an electro-optic element is controlled by an active element disposed in the same pixel together with the electro-optic element, for example, by an insulation gate type electric field effect transistor. In general, a TFT (Thin Film Transistor) is used as the insulation gate type electric field effect transistor. It is easy to realize a large-scale and high precision active matrix type display apparatus since the electro-optic element continues emitting light during a period of one display frame.

A pixel circuit driven according to an active matrix type and including the current-driven-type electro-optic element includes a driving circuit driving the electro-optic element in addition to the electro-optic element. As the driving circuit, there is known a pixel circuit including the organic El element 21, which is a current-driven-type electro-optic element, a driving transistor 22, a writing transistor 23, and a holding capacitor 24 (for example, see Japanese Unexamined Patent Application Publication No. 2008-310127).

Japanese Unexamined Patent Application Publication No. 2008-310127 discloses a so-called bootstrap operation of varying a gate potential $V_g$ in association with a source potential $V_s$ of the driving transistor 22 when a gate electrode of the driving transistor 22 is in a floating state (see paragraph 0071 of Japanese Unexamined Patent Application Publication No. 2008-310127). According to Japanese Unexamined Patent Application Publication No. 2008-310127, a gate-source voltage $V_{gs}$ of the driving transistor 22 is maintained constantly even when an I-V characteristic of the organic EL element 21 is changed with time due to the bootstrap operation. Therefore, the light emission luminance is maintained constantly (see paragraph 0093 of Japanese Unexamined Patent Application Publication No. 2008-310127).

SUMMARY OF THE INVENTION

In the above-described bootstrap operation, a ratio ($=\Delta V_g/\Delta V_s$) of a variation $\Delta V_g$ of the gate potential $V_g$ to a variation $\Delta V_s$ of the source potential $V_s$ of the driving transistor 22 is a bootstrap gain $G_b$. In addition, the bootstrap gain $G_b$ is determined by the capacitance value of the holding capacitor 24 or the capacitance value of the parasitic capacitance inherent in the gate electrode of the driving transistor 22.

When the parasitic capacitance inherent in the gate electrode of the driving transistor 22, particularly, the capacitance value of the parasitic capacitance between the gate and source of the driving transistor 22, is large, the bootstrap gain $G_b$ varies from an ideal state ($G_b=1$). Specifically, the bootstrap gain $G_b$ deteriorates. Then, since the light emission state may not be maintained for the gate-source voltage $V_{gs}$ of the driving transistor 22 while maintaining a difference $\Delta V_{th}$ of a threshold value voltage $V_{th}$ between the pixels, variation in luminance occurs between the pixels (of which the details will be described below). The variation in luminance between the pixels is viewed as a vertical stripe, a horizontal stripe, or luminance irregularity. As a consequence, the uniformity of a screen may be damaged.

In light of the foregoing, it is desirable to provide a display apparatus capable of improving a bootstrap gain by reducing the capacitance value of a parasitic capacitance between the gate and the source of a driving transistor and realizing a high-quality display image, a method of manufacturing the display apparatus, and an electronic apparatus.

According to an embodiment of the invention, there is provided a display apparatus including a plurality of pixels each including an electro-optic element, a writing transistor writing a video signal into the pixel, a holding capacitor holding the video signal written by the writing transistor, and a driving transistor driving the electro-optic element based on the video signal held in the holding capacitor. The driving transistor includes a channel region, a gate electrode disposed opposite to the channel region, a first source/drain region closer to a power source, a second source/drain region closer to the electro-optic element, and impurity regions disposed between the channel region and the first and second source/drain regions and having a lower concentration than that of the corresponding source/drain region. The impurity region disposed between the channel region and the first source/drain region is formed in a region other than a region facing the gate electrode.

According to another embodiment of the invention, there is provided a method of manufacturing a display apparatus which includes a plurality of pixels each including an electro-optic element, a writing transistor writing a video signal into the pixel, a holding capacitor holding the video signal written by the writing transistor, and a driving transistor driving the electro-optic element based on the video signal held in the holding capacitor. The method includes the steps of: when forming the driving transistor, forming a gate electrode and a semiconductor layer on a substrate and forming a photoresist in a displaced state with respect to a center of the gate electrode; and then forming an impurity region between a source/drain region closer to a power source and a channel region by performing patterning by exposure from a surface of the substrate using the photoresist as a mask, and then implanting impurities. According to this manufacturing method, the impurity region located between the channel region and the source/drain region closer to the power source is formed in the region other than the region facing the gate electrode.

The driving transistor has an LDD (Lightly Doped Drain) configuration in which the impurity regions with lower concentration than the source/drain regions, that is, LDD regions, are formed between the channel region and the first and second source/drain regions. When the LDD region and the gate electrode face each other in the LDD configuration, the parasitic capacitance is formed in the facing region. Therefore, the capacitance value of the parasitic capacitance is one of the parameters determining the bootstrap gain. Here, the LDD region located between the channel region and the first source/drain region is formed in the region other than the region facing the gate electrode. With such a configuration, the bootstrap gain can be improved since the capacitance value of the parasitic capacitance between the LDD region and the gate electrode, that is, between the gate and the source of the driving transistor is reduced.

According to the embodiments of the invention, the bootstrap gain can be improved by reducing the capacitance value of the parasitic capacitance between the gate and the source of the driving transistor. Therefore, the high-quality display image can be achieved without damage to the uniformity of a screen.

BRIEF DESCRIPTION OF THE DRAWINGS

FIG. 4 is a diagram illustrating a timing waveform to describe a basic circuit operation of the organic EL display apparatus according to the embodiment of the invention.

FIG. 10 is a diagram illustrating a timing waveform to describe a bootstrap operation.

FIG. 14 is a diagram illustrating a timing waveform to describe a decrease in the current of the driving transistor due to an increase in the voltage of the organic EL element.

FIGS. 15A and 15B are plan and sectional views illustrating the configuration of a driving transistor according to the related art.

FIGS. 16A and 16B are plan and sectional views illustrating the configuration of a driving transistor according to an embodiment.

FIG. 23A is a front view illustrating an opened cellular phone according to an embodiment of the invention, FIG. 23B is a side view illustrating the opened cellular phone, FIG. 23C is a front view illustrating the closed cellular phone, FIG. 23D is a left front view illustrating the closed cellular phone, FIG. 23E is a right front view illustrating the closed cellular phone, FIG. 23F is a diagram illustrating the upper surface of the closed cellular phone, and FIG. 23G is a diagram illustrating the lower surface of the closed cellular phone.

DESCRIPTION OF THE PREFERRED EMBODIMENTS

Hereinafter, a preferred embodiment (hereinafter, referred to as an "embodiment") of the invention will be described in detail with the drawings. The description thereof will be made in the following order.

1. Organic EL Display Apparatus according to Embodiment of the Invention
  1-1. System Configuration
  1-2. Basic Circuit Operation
  1-3. Bootstrap Operation
2. Organic EL Display Apparatus according to Embodiment
3. Modified Examples
4. Electronic Apparatus

1. Organic EL Display Apparatus According to Embodiment of the Invention

1-1. System Configuration

Figure 1:
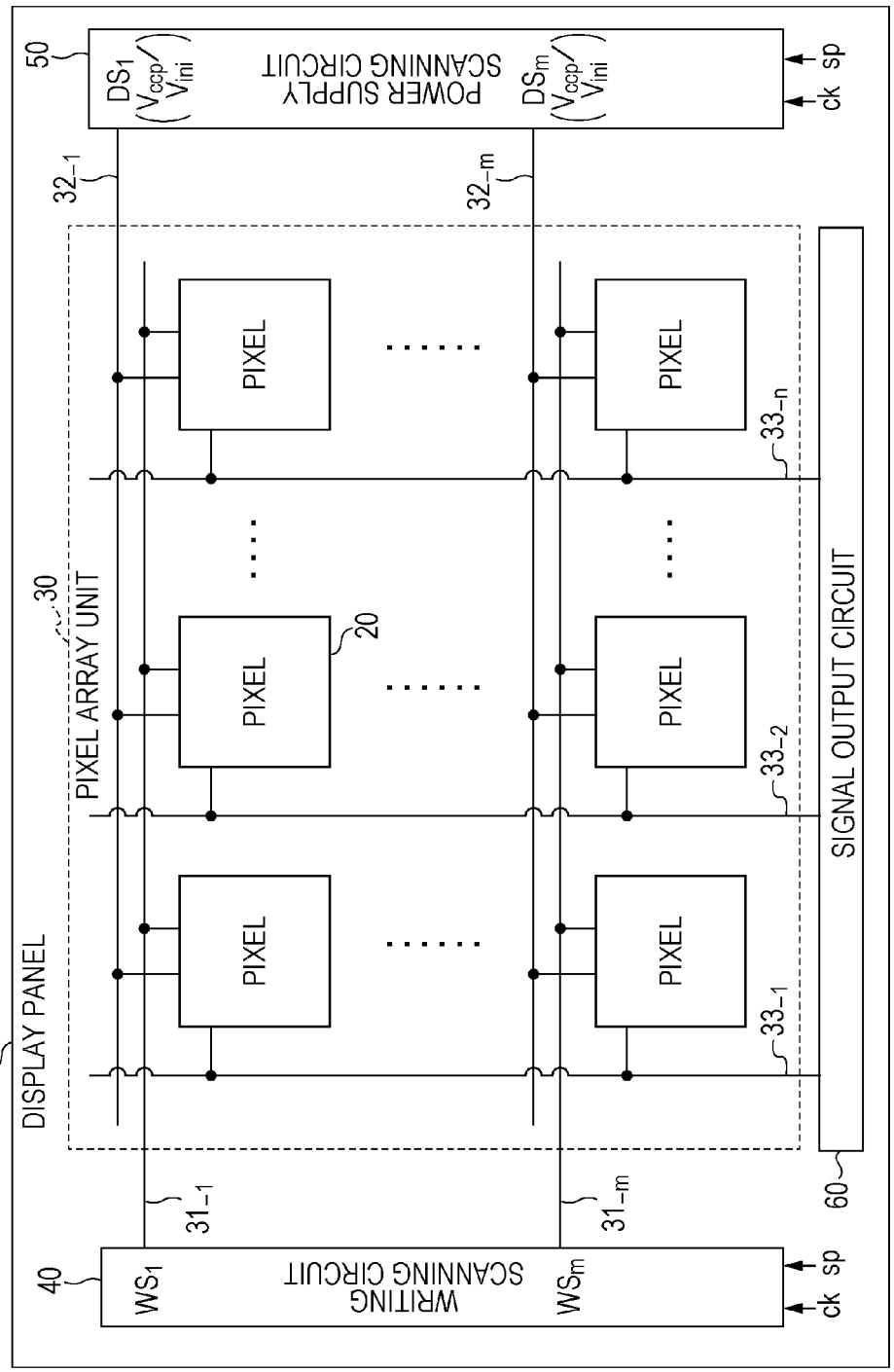
FIG. 1 is a schematic diagram illustrating the system configuration of an organic EL display apparatus according to an embodiment of the invention.

FIG. 1 is a schematic diagram illustrating the system configuration of an active matrix type display apparatus according to an embodiment of the invention.

The active matrix type display apparatus is a display apparatus in which current flowing in an electro-optic element is controlled by an active element, such as the electro-optic element, formed in a pixel, for example, an insulation gate type electric field effect transistor. In general, a TFT (Thin Film Transistor) is used as the insulation gate type electric field effect transistor.

Hereinafter, for example, an active matrix type organic EL display apparatus will be described in which a current-driven-type electro-optic element, such as an organic EL element, in which light emission luminance varies according to the value of current flowing in a device, is used as a light-emitting element of a pixel (pixel circuit).

As shown in FIG. 1, an organic EL display apparatus 10 according to the embodiment includes a plurality of pixels 20 which each include an organic EL element, a pixel array unit 30 in which the pixels 20 are arranged two-dimensionally in a matrix form, and driving units which are disposed in the periphery of the pixel array unit 30. The driving units include a writing scanning circuit 40, a power supply scanning circuit 50, and a signal output circuit 60. The driving units drive the respective pixels 20 of the pixel array unit 30.

When the organic EL display apparatus 10 realizes color display, one pixel includes a plurality of sub-pixels and each of the sub-pixels corresponds to the pixel 20. More specifically, in a display apparatus for color display, one pixel includes three sub-pixels: a sub-pixel emitting red light (R), a sub-pixel emitting green light (G), and a sub-pixel emitting blue light (B).

However, the invention is not limited to the configuration in which one pixel includes the sub-pixels for the three primary colors of RGB. Instead, one pixel may further include a sub-pixel for one color or sub-pixels for a plurality of colors in addition to the sub-pixels for the three primary colors. More specifically, for example, one pixel may be configured by adding a sub-pixel emitting white light (W) to improve luminance or by adding at least one sub-pixel emitting a complementary color to expand a color reproduction range.

In the pixel array unit 30, scanning lines 31-1 to 31-$m$ and power supply lines $32_{-1}$ to $32_{-m}$ are arranged in a row direction (arrangement direction of the pixels of a pixel line) for each pixel row to correspond to the arrangement of the pixels 20 of m rows and n columns. Moreover, signal lines $33_{-1}$ to $33_{-n}$ are arranged in a column direction (arrangement direction of the pixels of a pixel column) for each pixel column.

The scanning lines $31_{-1}$ to $31_{-m}$ are respectively connected to output terminals of the corresponding rows of the writing scanning circuit 40. The power supply lines $32_{-1}$ to $32_{-m}$ are respectively connected to output terminals of the corresponding rows of the power supply scanning circuit 50. The signal lines 33-1 to 33-$n$ are respectively connected to output terminals of the corresponding columns of the signal output circuit 60.

In general, the pixel array unit 30 is formed on a transparent insulation substrate such as a glass substrate. Thus, the organic EL display apparatus 10 has a flat type panel configuration. A driving circuit of each pixel 20 of the pixel array unit 30 can be formed using an amorphous silicon TFT or a low-temperature polysilicon TFT. When the low-temperature polysilicon TFT is used, as shown in FIG. 1, the writing scanning circuit 40, the power supply scanning circuit 50, and the signal output circuit 60 can also be mounted on a display panel (substrate) 70 in which the pixel array unit 30 is formed.

The writing scanning circuit 40 includes a shift register that sequentially shifts (transmits) start pulses sp in synchronization with a clock pulse ck. The writing scanning circuit 40 sequentially scans (performs line sequential scanning) the respective pixels 20 of the pixel array unit 30 in a row unit by sequentially supplying writing scanning signals WS (WS1 to WSm) to the scanning lines 31-1 to 31-$m$, when video signals are written to the respective pixels 20 of the pixel array unit 30.

The power supply scanning circuit 50 includes a shift register that sequentially shifts the start pulses sp in synchronization with the clock pulse ck. The power supply scanning circuit 50 supplies power potentials DS (DS1 to DSm), which are switched between a first power potential $V_{ccp}$ and a second power potential $V_{ini}$ lower than the first power potential $V_{ccp}$, to the power supply lines $32_{-1}$ to $32_{-m}$ in synchronization with the line sequential scanning of the writing scanning circuit 40. As described below, the control of light emission and non-light emission of the pixel 20 are controlled by the switch between $V_{ccp}$ and $V_{ini}$ of the power potential DS.

The signal output circuit 60 selectively outputs a signal voltage (hereinafter, simply referred to as a "signal voltage") $V_{sig}$ and a reference voltage $V_{ofs}$ of a video signal supplied according to luminance information supplied from a signal supply source (not shown). Here, the reference voltage $V_{ofs}$ is a voltage (for example, a voltage corresponding to a black level of a video signal) serving as the reference of the signal voltage $V_{sig}$ and is used when a threshold value described below is corrected.

The signal voltage $V_{sig}$/the reference voltage $V_{ofs}$ output from the signal output circuit 60 are written to the respective pixels 20 of the pixel array unit 30 via the signal line 33-1 to 33-$n$ in a pixel row unit selected by the scanning of the writing scanning circuit 40. That is, the signal output circuit 60 has a driving configuration of line sequential writing in which the signal voltage $V_{sig}$ is written in a row (line) unit.

Pixel Circuit

Figure 2:
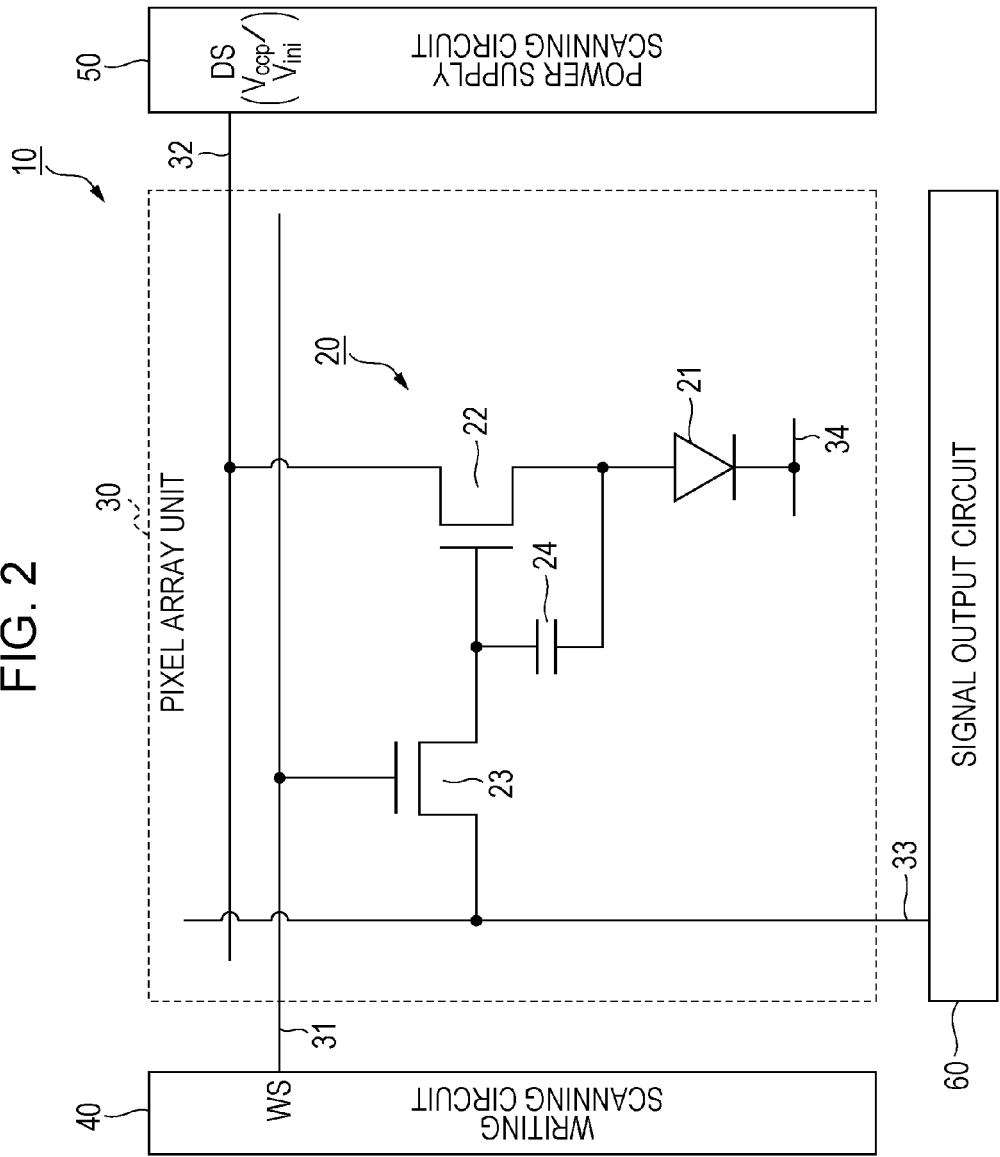
FIG. 2 is a circuit diagram illustrating an example of the circuit configuration of a pixel of the organic EL display apparatus according to the embodiment of the invention.

FIG. 2 is a circuit diagram illustrating the specific circuit configuration of the pixel (pixel circuit) 20.

As shown in FIG. 2, the pixel 20 includes an organic EL element 21, which is a current-driven-type electro-optic element in which light emission luminance varies according to the value of a current flowing in a device, and a driving circuit, which drives the organic EL element 21 by allowing the current to flow to the organic EL element 21. In the organic EL element 21, a cathode electrode is connected to a common power supply line 34 commonly wired (wired in a so-called solid manner) to all of the pixels 20.

The driving circuit driving the organic EL element 21 includes a driving transistor 22, a writing transistor 23, and a holding capacitor 24. An N channel TFT can be used as the driving transistor 22 and the writing transistor 23. However, a combination of the conductive types of the driving transistor 22 and the writing transistor 23 described herein is just an example and the invention is not limited to this combination.

When the N channel TFT is used as the driving transistor 22 and the writing transistor 23, the N channel TFT can be used using an amorphous silicon (a-si) process. By using the a-si process, it is possible to reduce cost for generating the TFT and cost of the organic EL display apparatus 10. When the driving transistor 22 and the writing transistor 23 are combined using the same conductive type, both the transistors 22 and 23 can be manufactured by the same process, thereby achieving low cost.

One electrode (source/drain electrode) of the driving transistor 22 is connected to the anode of the organic EL element 21 and the other electrode (drain/source electrode) thereof is connected to the power supply line 32 ($32_{-1}$ to $32_{-m}$).

One electrode (source/drain electrode) of the writing transistor 23 is connected to the signal line 33 (33-1 to 33-$n$) and the other electrode (drain/source electrode) thereof is connected to the gate electrode of the driving transistor 22. Moreover, the gate electrode of the writing transistor 23 is connected to the scanning line 31 (31-1 to 31-$m$).

In the driving transistor 22 and the writing transistor 23, one electrode refers to a metal wiring electrically connected to a source/drain region and the other electrode refers to a metal wiring electrically connected to a drain/source region. According to a potential relationship between one electrode and the other electrode, when one electrode serves as a source electrode, the other electrode serves as the drain electrode and vice versa.

One electrode of the holding capacitor 24 is connected to the gate electrode of the driving transistor 22, and the other electrode thereof is connected to the other electrode of the driving transistor 22 and the anode electrode of the organic EL element 21.

The driving circuit of the organic EL element 21 is not limited to the configuration in which two transistors of the driving transistor 22 and the writing transistor 23 and one capacitor of the holding capacitor 24 are included. For example, a circuit configuration may be realized in which an auxiliary capacitor of which one electrode is connected to the anode electrode of the organic EL element 21 and the other electrode is connected to a fixed positional is provided, as necessary, to supplement an insufficient capacitance of the organic EL element 21.

In the pixel 20 with the above-described configuration, the writing transistor 23 enters a conductive state in response to a high active writing scanning signal WS applied from the writing scanning circuit 40 to the gate electrode via the scanning line 31. Then, the writing transistor 23 samples the signal voltage $V_{sig}$ or the reference voltage $V_{ofs}$ of the video signal according to luminance information supplied from the signal output circuit 60 via the signal line 33 and writes the sampled the signal voltage $V_{sig}$ or the reference voltage $V_{ofs}$ to the pixel 20. The written signal voltage $V_{sig}$ or the written reference voltage $V_{ofs}$ is applied to the gate electrode of the driving transistor 22 and is simultaneously held in the holding capacitor 24.

The driving transistor 22 operates in a saturation region in a state where one electrode serves as a drain electrode and the other electrode serves as a source electrode, when a potential DS of the power supplied line 32 ($32_{-1}$ to $32_{-m}$) is a first power potential $V_{ccp}$. Then, the driving transistor 22 receives a current from the power supply line 32 and allows the organic EL element 21 to emit light by the current driving. More specifically, the driving transistor 22 operates in the saturation region, and thus by supplying the driving current with the current value corresponding to the voltage value of the signal voltage $V_{sig}$ held in the holding capacitor 24 to the organic EL element 21, the organic EL element 21 emits light by the current driving.

Moreover, when the power potential DS is varied from the first power potential $V_{ccp}$ to a second power potential $V_{ini}$, one electrode and the other electrode of the driving transistor 22 serve as a source electrode and a drain electrode, respectively, and thus the driving transistor 22 operates as a switching transistor. Thus, the supply of the driving current to the organic EL element 21 is stopped and thus the driving transistor 22 allows the organic EL element 21 to enter a non-light emission state. That is, the driving transistor 22 also has a function of a transistor controlling light emission/non-light emission of the organic EL element 21.

By providing a period (non-light emission period) in which the organic EL element 21 is in the non-light emission state by the switching operation of the driving transistor 22, it is possible to control a ratio (duty) between the light emission period and the non-light emission period of the organic EL element 21. Since the control of the duty enables afterimage blurring caused when pixels emit light during one display frame period to be reduced, particularly it is possible to achieve a high image quality of a video.

Of the first power potential $V_{ccp}$ and the second power potential $V_{ini}$ selectively supplied from the power supply scanning circuit 50 via the power supply line 32, the first power potential $V_{ccp}$ is a power potential that is supplied to the driving transistor 22 driving the light emission of the organic EL element 21. Moreover, the second power potential $V_{ini}$ is a power potential that is used to apply a reverse bias to the organic EL element 21. The second power potential $V_{ini}$ is set to be lower than the reference voltage $V_{ofs}$, for example, lower than $V_{ofs}$-$V_{th}$ on the assumption that the threshold voltage of the driving transistor 22 is $V_{th}$, and is preferably set to be sufficiently lower than $V_{ofs}$-$V_{th}$.

Pixel Configuration

Figure 3:
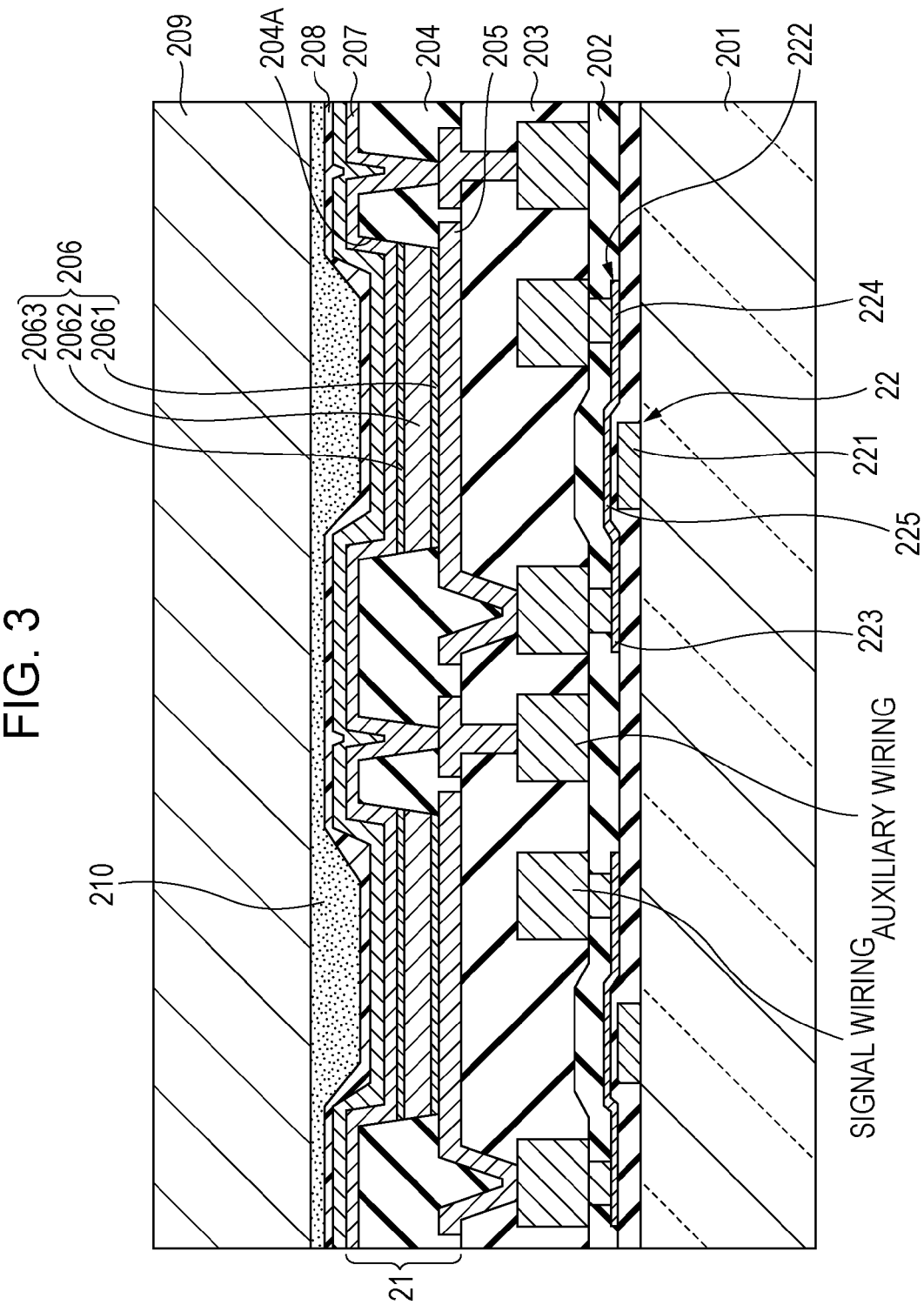
FIG. 3 is a sectional view illustrating an example of the cross-section structure of the pixel.

FIG. 3 is a sectional view illustrating an example of a cross-section structure of the pixel 20. As shown in FIG. 3, the driving circuit including the driving transistor 22 is formed on a glass substrate 201. In the pixel 20, an insulation film 202, an insulation flattening film 203, and a wind insulation film 204 are sequentially formed on the glass substrate 201. The organic EL element 21 is formed in a concave portion 204A of the wind insulation film 204. Here, only the driving transistor 22 is illustrated among the constituent elements of the driving circuit, and the other constituent elements are not illustrated.

The organic EL element 21 includes an anode electrode 205, an organic layer (including an electron transport layer, a light emission layer, and a hole transport layer/hole injection layer) 206, and a cathode electrode 207. The anode electrode 205 is formed of a metal or the like formed on the bottom of the concave portion 204A of the wind insulation film 204. The organic layer 206 is formed on the anode electrode 205. The cathode electrode 207 is formed from a transparent conductive film or the like on the organic layer 206 so as to be common to all of the pixels.

In the organic EL element 21, the organic layer 206 is formed by sequentially laminating a hole transport layer/hole injection layer 2061, a light emission layer 2062, an electron transport layer 2063, and an electron injection layer (not shown) on the anode electrode 205. Moreover, light is configured to be emitted when electrons and holes are recombined in the light emission layer 2062 of the organic layer 206 by allowing a current to flow from the driving transistor 22 to the organic layer 206 via the anode electrode 205 under the current driving of the driving transistor 22 shown in FIG. 2.

The driving transistor 22 includes a gate electrode 221, source/drain regions 223 and 224 formed on both sides of a semiconductor layer 222, and a channel formation region 225 facing the gate electrode 221 of the semiconductor layer 222. The source/drain region 223 is electrically connected to the anode electrode 205 of the organic EL element 21 via a contact hole.

As shown in FIG. 3, the organic EL element 21 is formed on the glass substrate 201 with the insulation film 202, the insulation flattening film 203, and the wind insulation film 204 interposed therebetween in a pixel unit, and then a sealing substrate 209 is adhered by an adhesive 210 with a passivation film 208 interposed therebetween. A display panel 70 is formed by sealing the organic EL element 21 by the sealing substrate 209.

1-2. Basic Circuit Operation

Hereinafter, a basic circuit operation of the organic EL display apparatus 10 with the above-described configuration will be described with reference to a timing waveform diagram of FIG. 4, and operation description diagrams of FIGS. 5 and 6. In the operation description diagrams of FIGS. 5 and 6, the writing transistor 23 is illustrated by a switch symbol for simple illustration. An equivalent capacitor 25 of the organic EL element 21 is also illustrated.

In the timing waveform diagram of FIG. 4, respective variations in the potential (writing scanning signal) WS of the scanning line 31, the potential (power potential) DS of the power supply line 32, the potentials ($V_{sig}/V_{ofs}$) of the signal line 33, and the gate potential $V_g$ and the source potential $V_s$ of the driving transistor 22 are shown.

Light Emission Period of Preceding Display Frame

In the timing waveform diagram of FIG. 4, a period before time $t_{11}$ is a light emission period of the organic EL element 21 in the preceding display frame. In the light emission period of the preceding display frame, the potential DS of the power supply line 32 is the first power potential (hereinafter, referred to as a "high potential") $V_{ccp}$ and the writing transistor 23 is in the non-conductive state.

Figure 5A:
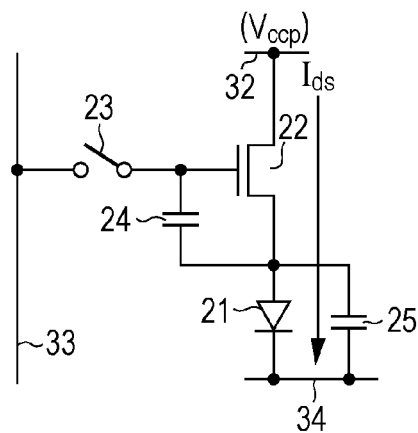
FIGS. 5A to 5D are diagrams (part 1) illustrating the basic circuit operation of the organic EL display apparatus according to the embodiment of the invention.

At this time, the driving transistor 22 is designed to operate in the saturation region. Therefore, as shown in FIG. 5A, a driving current (drain-source current) $I_{ds}$ corresponding to the gate-source voltage $V_{gs}$ of the driving transistor 22 is supplied from the power supply line 32 to the organic EL element 21 via the driving transistor 22. Accordingly, the organic EL element 21 emits light with luminance corresponding to the current value of the driving current $I_{ds}$.

Threshold Value Correction Preparation Period

Figure 5B:
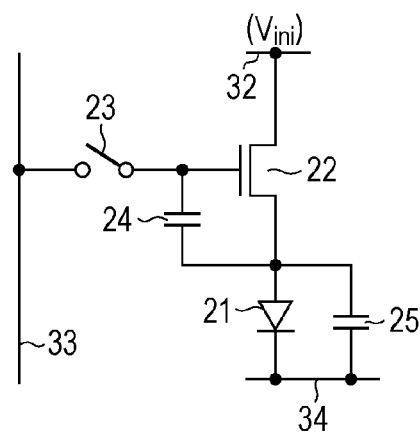

At time $t_{11}$, a new display frame (current display frame) of the line sequential scanning is entered. As shown in FIG. 5B, the potential DS of the power supply line 32 is varied from the high potential $V_{ccp}$ to the second power potential (hereinafter, a "low potential") $V_{ini}$, which is sufficiently lower than $V_{ofs}$-$V_{th}$ with reference to the reference voltage $V_{ofs}$ of the signal line 33.

Here, it is assumed that the threshold value of the organic EL element 21 is $V_{the1}$ and the potential (cathode potential) of the common power supply line 34 is $V_{cath}$. At this time, when the lower potential $V_{ini}$ satisfies a relation of $V_{ini} < V_{the1} + V_{cath}$, the source potential $V_s$ of the driving transistor 22 is roughly the same as the lower potential $V_{ini}$. Therefore, the organic EL element 21 enters a reverse bias state and thus turns off.

Figure 5C:
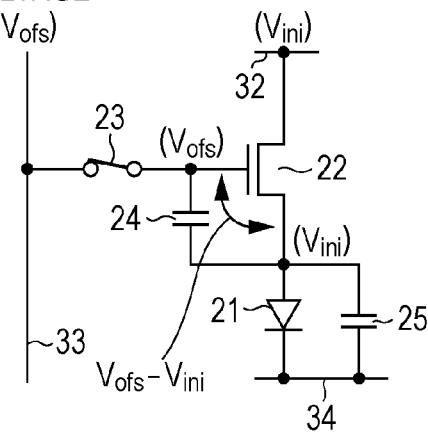

Next, at time $t_{12}$, the potential WS of the scanning line 31 is transited from the lower potential to the high potential. Therefore, as shown in FIG. 5C, the writing transistor 23 enters a conductive state. At this time, since the reference voltage $V_{ofs}$ is supplied from the signal output circuit 60 to the signal line 33, the gate potential $V_g$ of the driving transistor 22 becomes the reference voltage $V_{ofs}$. The source potential $V_s$ of the driving transistor 22 becomes the lower potential $V_{ini}$ sufficiently lower than the reference voltage $V_{ofs}$.

At this time, the gate-source voltage $V_{gs}$ of the driving transistor 22 becomes $V_{ofs}$-$V_{ini}$. Here, when $V_{ofs}$-$V_{ini}$ is not larger than the threshold value voltage $V_{th}$ of the driving transistor 22, a threshold value correction process described below is not performed. Therefore, it is necessary to set a potential relation of $V_{ofs}$-$V_{ini}$>$V_{th}$.

A process of fixing the gate potential $V_g$ of the driving transistor 22 to the reference voltage $V_{ofs}$ and fixing the source potential $V_s$ to the lower potential $V_{ini}$ to perform an initialization process is a preparation (threshold value correction preparation) process performed before the threshold value correction process (threshold value auxiliary operation) described below. Therefore, the reference voltage $V_{ofs}$ and the lower potential $V_{ini}$ are initial potentials of the gate potential $V_g$ and the source potential $V_s$ of the driving transistor 22, respectively.

Threshold Value Correction Period

Figure 5D:
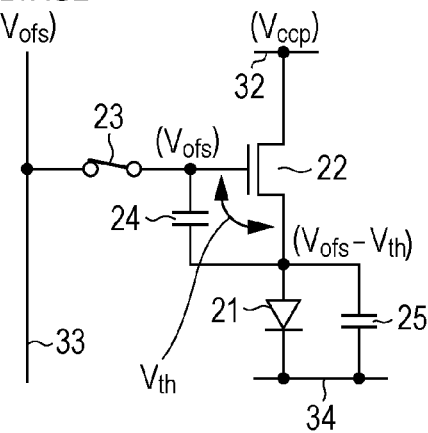

Next, when the potential DS of the power supply line 32 is varied from the low potential $V_{ini}$ to the high potential $V_{cpp}$ at time $t_{13}$, as shown in FIG. 5D, the threshold value correction process is started while the gate potential $V_g$ of the driving transistor 22 is maintained. That is, the source potential $V_s$ of the driving transistor 22 starts to increase toward a potential obtained by reducing the threshold value voltage $V_{th}$ of the driving transistor 22 from the gate potential $V_g$.

Here, for convenience sake, a process of varying the source potential $V_s$ toward the potential obtained by reducing the threshold value voltage $V_{th}$ of the driving transistor 22 from the initial potential $V_{ofs}$ with reference to the initial potential $V_{ofs}$ of the gate electrode of the driving transistor 22 is referred to as a threshold value correction process. When the threshold value correction process is performed, the gate-source voltage $V_{gs}$ of the driving transistor 22 converges to the threshold value voltage $V_{th}$ of the driving transistor 22. The voltage corresponding to the threshold value voltage $V_{th}$ is held in the holding capacitor 24.

The potential $V_{cath}$ of the common power supply line 34 is set so that the organic EL element 21 is in a cutoff state in order to flow the current only to the holding capacitor 24 and not to flow the current toward the organic EL element 21 during the period (threshold value correction period) in which the threshold value correction process is performed.

Figure 6A:
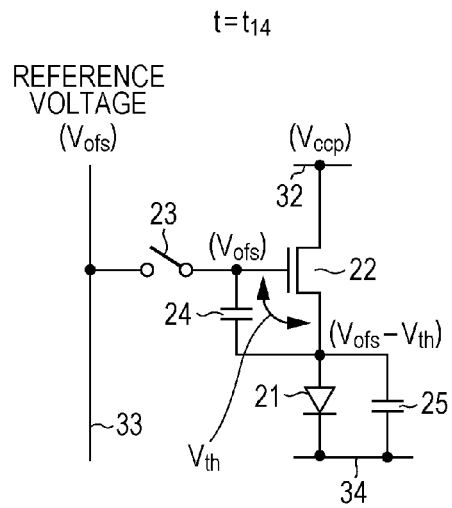
FIGS. 6A to 6D are diagrams (part 2) illustrating the basic circuit operation of the organic EL display apparatus according to the embodiment of the invention.

Next, at time $t_{14}$, the potential WS of the scanning line 31 is transited toward the low potential. Then, as shown in FIG. 6A, the writing transistor 23 enters the non-conductive state. At this time, the gate electrode of the driving transistor 22 enters a floating state by electrically separating the gate electrode from the signal line 33. However, since the gate-source voltage $V_{gs}$ is the same as the threshold value voltage $V_{th}$ of the driving transistor 22, the driving transistor 22 is in the cutoff state. Accordingly, the drain-source current $I_{ds}$ does not flow to the driving transistor 22.

Signal Writing & Mobility Correction Period

Figure 6B:
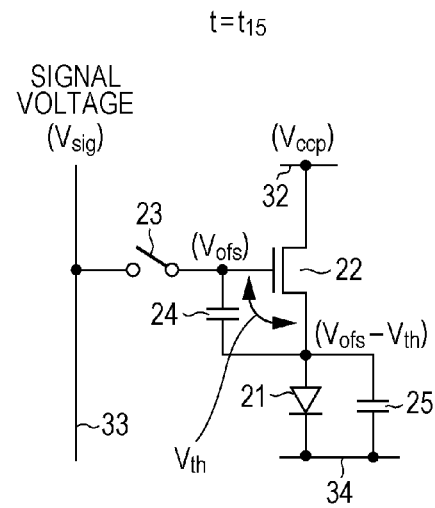
Figure 6C:
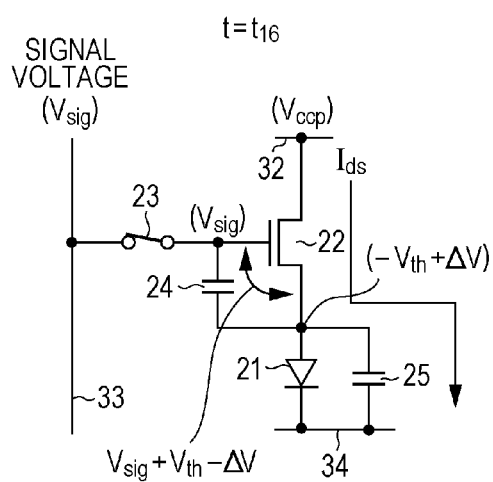

Next, at time $t_{15}$, the potential of the signal line 33 is varied from the reference voltage $V_{ofs}$ to the signal voltage $V_{sig}$ of the video signal, as shown in FIG. 6B. Subsequently, at time $t_{16}$, the potential WS of the scanning line 31 is transited toward the high potential. Then, as shown in FIG. 6C, the writing transistor 23 enters the conductive state and the signal voltage $V_{sig}$ of the video signal is sampled and written into the pixel 20.

When the signal voltage $V_{sig}$ is written into the writing transistor 23, the gate potential $V_g$ of the driving transistor 22 becomes the signal voltage $V_{sig}$. In addition, when the driving transistor 22 is driven by the signal voltage $V_{sig}$ of the video signal, the threshold value voltage $V_{th}$ of the driving transistor 22 is cancelled by the voltage corresponding to the threshold value voltage $V_{th}$ held in the holding capacitor 24. The principle of cancelling the threshold value will be described in detail.

At this time, the organic EL element 21 is in the cutoff state (high impedance state). Therefore, the current (drain-source current $I_{ds}$) flowing from the power supply line 32 to the driving transistor 22 according to the signal voltage $V_{sig}$ of the video signal flows into the equivalent capacitor 25 of the organic EL element 21, and thus charging of the equivalent capacitor 25 starts.

When the equivalent capacitor 25 of the organic EL element 21 is charged, the source potential $V_s$ of the driving transistor 22 gradually increases with time. At this time, since a variation in the threshold value voltage $V_{th}$ of the driving transistor 22 is already cancelled in each pixel, the drain-source current $I_{ds}$ of the driving transistor 22 depends on a mobility μ of the driving transistor 22. The mobility μ of the driving transistor 22 is a mobility of a semiconductor thin film forming the channel of the corresponding driving transistor 22.

Here, it is supposed that a ratio of the holding voltage $V_{gs}$ of the holding capacitor 24 to the signal voltage $V_{sig}$ of the video signal, that is, a writing gain G is 1 (ideal value). Then, the source potential $V_s$ of the driving transistor 22 increases up to a potential of $V_{ofs}-V_{th}+\Delta V$, and thus the gate-source voltage $V_{gs}$ of the driving transistor 22 becomes $V_{sig}-V_{ofs}+V_{th}-\Delta V$.

That is, an increase $\Delta V$ of the source potential $V_s$ of the driving transistor 22 is subtracted from the voltage ($V_{sig}-V_{ofs}+V_{th}$) held in the holding capacitor 24. In other words, negative feedback is applied so that the accumulated charges of the holding capacitor 24 are discharged. Therefore, the increase $\Delta V$ of the source potential $V_s$ becomes the feedback amount of the negative feedback.

Thus, by applying the negative feedback to the gate-source voltage $V_{gs}$ by the feedback amount $\Delta V$ corresponding to the drain-source current $I_{ds}$ flowing in the driving transistor 22, the dependency on the mobility μ of the drain-source current $I_{ds}$ of the driving transistor 22 can be cancelled. This cancelling process is a mobility correction process of correcting a variation in the mobility μ of the driving transistor 22 between the pixels.

More specifically, since the higher a signal amplitude $V_{in}$ (=$V_{sig}-V_{ofs}$) of the video signal written into the gate electrode of the driving transistor 22 is, the higher the drain-source current $I_{ds}$ is, the absolute value of the feedback amount $\Delta V$ of the negative feedback also increases. Accordingly the mobility correction process is performed according to the level of the light emission luminance.

When the signal amplitude $V_{in}$ of the video signal is made constant, the absolute value of the feedback amount $\Delta V$ of the negative feedback increases as the mobility μ of the driving transistor 22 increases. Therefore, the variation in the mobility μ between the pixels can be removed.

Accordingly, the feedback amount $\Delta V$ of the negative feedback can be said to be a correction amount of the mobility correction. The principle of the mobility correction will be described in detail below.

Light Emission Period

Figure 6D:
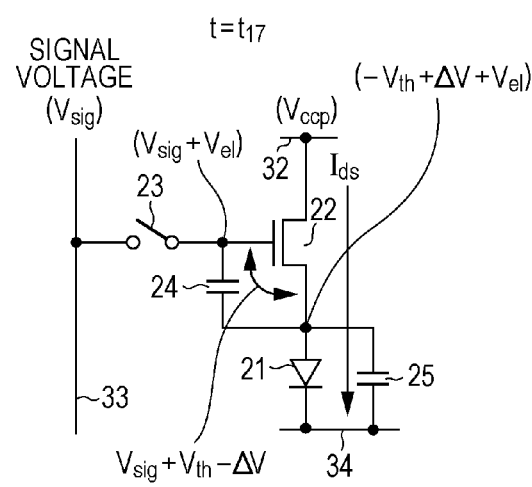

Next, at time $t_{17}$, the potential WS of the scanning line 31 is transited toward the low potential. As shown in FIG. 6D, the writing transistor 23 enters the non-conductive state. Thus, the gate electrode of the driving transistor 22 enters the floating state, since the gate electrode is electrically separated from the signal line 33.

Here, when the gate electrode of the driving transistor 22 is in the floating state, the holding capacitor 24 is connected between the gate and the source of the driving transistor 22. Therefore, the gate potential $V_g$ is also varied in association with the variation in the source potential $V_s$ of the driving transistor 22. Thus, an operation of varying the gate potential $V_g$ of the driving transistor 22 in association with the variation in the source potential $V_s$ is a bootstrap operation of the holding capacitor 24.

When the gate electrode of the driving transistor 22 enters the floating state and the drain-source current $I_{ds}$ of the driving transistor 22 starts flowing in the organic EL element 21, the anode potential of the organic EL element 21 is increased according to the current $I_{ds}$.

When the anode potential of the organic EL element 21 exceeds $V_{the1}+V_{cath}$, the driving current starts flowing in the organic EL element 21. Therefore, the organic EL element 21 starts emitting light. The increase in the anode potential of the organic EL element 21 is neither more nor less than the increase in the source potential $V_s$ of the driving transistor 22. When the source potential $V_s$ of the driving transistor 22 increases, the gate potential $V_g$ of the driving transistor 22 increases together by the bootstrap operation of the holding capacitor 24.

At this time, when it is supposed that a bootstrap gain is 1 (ideal value), the increase amount of the gate potential $V_g$ is the same as the increase amount of the source potential $V_s$. Therefore, the gate-source voltage $V_{gs}$ of the driving transistor 22 is constantly held with $V_{sig}-V_{ofs}+V_{th}-\Delta V$ during the light emission period. Then, at time $t_{18}$, the potential of the signal line 33 is varied from the signal voltage $V_{sig}$ of the video signal to the reference voltage $V_{ofs}$.

In the above-described series of circuit operations, the threshold value correction preparation, the threshold value correction, the writing of the signal voltage $V_{sig}$, and the mobility correction are performed during one horizontal scanning period (1 H). Moreover, the signal writing and the mobility correction are performed in parallel during a period of time $t_6$ and time $t_7$.

Segmenting Threshold Value Correction

The driving method of performing the threshold value correction process once has hitherto been described. However, this driving method is just one example and the invention is not limited to this driving method. For example, a driving method may be performed such that so-called threshold value correction is performed during the 1 H period, in which the mobility correction and the signal writing process are together performed, and a plurality of horizontal scanning periods before the 1 H period by segmenting the threshold value correction process.

According to the driving method of the segmenting threshold value correction, a sufficient time can be ensured during the plurality of horizontal scanning periods as the threshold value correction period, even when allocation time is shortened in one horizontal scanning period due to an increase in the number of pixels caused by high precision. Therefore, the threshold value correction process can be reliably performed.

Principle of Threshold Value Cancellation

Hereinafter, the principle of the threshold value cancellation (that is, the threshold value correction) of the driving transistor 22 will be described. Since the driving transistor 22 is designed to operate in the saturation region, the driving transistor 22 operates as a constant current source. Thus, the constant drain-source current (driving current) $I_{ds}$ given in Expression (1) below is supplied from the driving transistor 22 to the organic EL element 21.

$$I_{ds}=(1/2)\cdot\mu(W/L)\cdot C_{ox}(V_{gs}-V_{th})^2 \quad (1)$$

In this expression, W is a channel width of the driving transistor 22, L is a channel length, and $C_{ox}$ is a gate capacitance per unit area.

Figure 7:
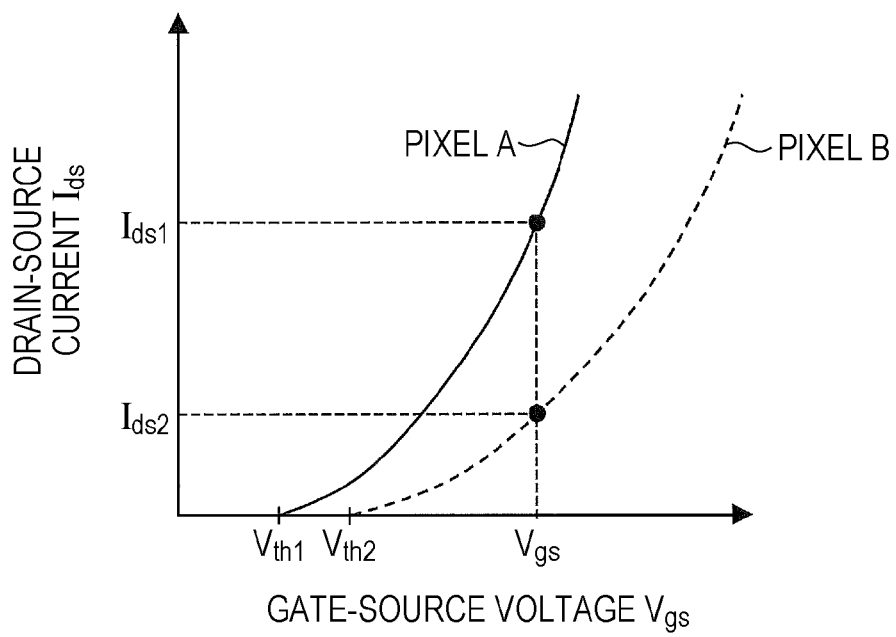
FIG. 7 is a diagram illustrating a characteristic to describe a problem caused due to a variation in a threshold value voltage $V_{th}$ of a driving transistor.

FIG. 7 is a diagram illustrating the characteristic of the gate-source voltage $V_{gs}$ to the drain-source current $I_{ds}$ of the driving transistor 22.

In a case where a process of cancelling the variation in the threshold value voltage $V_{th}$ of the driving transistor 22 in each pixel is not performed, as shown in the characteristic drawing, the drain-source current $I_{ds}$ corresponding to the gate-source voltage $V_{gs}$ becomes $I_{ds1}$, when the threshold value voltage $V_{th}$ is $V_{th1}$.

In addition, when the threshold value voltage $V_{th}$ is $V_{th2}$ ($V_{th2} > V_{th1}$) the drain-source current Ids corresponding the gate-source voltage $V_{gs}$ is $I_{ds2}$ ($I_{ds2} < I_{ds1}$). That is, when the threshold value voltage $V_{th}$ of the driving transistor 22 is varied, the drain-source current $I_{ds}$ is varied in spite of the fact that the gate-source voltage $V_{gs}$ is constant.

On the other hand, as described above, the gate-source voltage $V_{gs}$ of the driving transistor 22 is $V_{sig} - V_{ofs} + V_{th} - \Delta V$ in the pixel (pixel circuit) 20 with the above-described configuration, when the light is emitted. Therefore, when this value is substituted to Expression (1), the drain-source current $I_{ds}$ is expressed in Expression (2).

$$I_{ds} = (1/2) \cdot \mu (W/L) C_{ox} (V_{sig} - V_{ofs} + V_{th} - \Delta V)^2 \qquad (2)$$

That is, since the term of the threshold value voltage $V_{th}$ of the driving transistor 22 is cancelled, the drain-source current $I_{ds}$ supplied from the driving transistor 22 to the organic EL element 21 does not depend on the threshold value voltage $V_{th}$ of the driving transistor 22. As a consequence, although the threshold value voltage $V_{th}$ of the driving transistor 22 is varied in each pixel due to the variation, temporal change, or the like of the process of manufacturing the driving transistor 22. Therefore, it is possible to make the light emission luminance of the organic EL element 21 constant.

Principle of Mobility Correction

Figure 8:
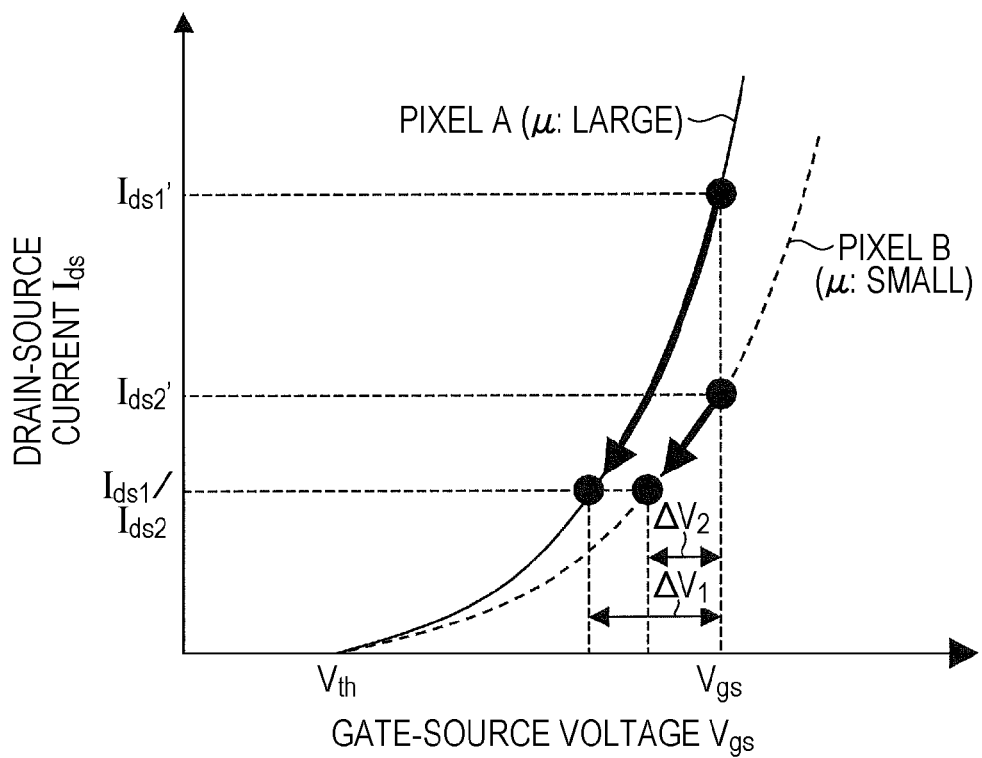
FIG. 8 is a diagram illustrating a characteristic to describe a problem caused due to a variation in a mobility μ of the driving transistor.

Next, the principle of the mobility correction of the driving transistor 22 will be described. FIG. 8 is a diagram illustrating characteristic curves to compare a pixel A with the relatively larger mobility μ of the driving transistor 22 to a pixel B with the relatively smaller mobility μ of the driving transistor 22. When the driving transistor 22 is formed of a polysilicon thin film transistor or the like, the variation in the mobility μ between the pixels may not be avoided as in the pixels A and B.

It is considered that the signal amplitude $V_{in}$ ($= V_{sig} - V_{ofs}$) of the same level is written to the gate electrode of the driving transistor 22, for example, the both pixels A and B in the state where there is the variation in the mobility μ between the pixels A and B. In this case, when the correction of the mobility μ is not performed, a large difference may occur between the drain-source current $I_{ds1}$' flowing in the pixel A with the large mobility μ and the drain-source current $I_{ds2}$' flowing in the pixel B with the small mobility μ. Accordingly, when the large difference occurs in the drain-source current $I_{ds}$ due to the variation in the mobility μ between the pixels, the uniformity of a screen is damaged.

Here, as apparent from the characteristic expression of the transistor of Expression (1) described above, the drain-source current $I_{ds}$ is increased when the mobility μ is increased. Therefore, the feedback amount $\Delta V$ of the negative feedback is increased as the mobility μ is increased. As shown in FIG. 8, a feedback amount $\Delta V_1$ of the pixel A with the large mobility μ is larger than a feedback amount $\Delta V_2$ of the pixel B with the small mobility μ.

Here, by applying the negative feedback to the gate-source voltage $V_{gs}$ with the feedback amount $\Delta V$ corresponding to the drain-source current $I_{ds}$ of the driving transistor 22 by the mobility correction process, the negative feedback becomes larger as the mobility μ is larger. As a consequence, it is possible to prevent the variation in the mobility μ between the pixels.

Specifically, when the feedback amount $\Delta V_1$ of the pixel A with the large mobility μ is corrected, the drain-source current $I_{ds}$ considerably drops from $I_{ds1}$' to $I_{ds1}$. On the other hand, since the feedback amount $\Delta V_2$ of the pixel B with the small mobility μ is small, the drain-source current $I_{ds}$ considerably drops from $I_{ds2}$' to $I_{ds2}$. Therefore, the drain-source current $I_{ds}$ does not largely drop. As a consequence, since the drain-source current $I_{ds1}$ of the pixel A becomes substantially the same as the drain-source current $I_{ds2}$ of the pixel B, the variation in the mobility μ between the pixels is corrected.

To sum up, when there are the pixels A and B different in the mobility μ, the feedback amount $\Delta V_1$ of the pixel A with the large mobility μ is comparatively larger than the feedback amount $\Delta V_2$ of the pixel B with the small mobility μ. That is, the feedback amount $\Delta V$ becomes larger as the mobility μ becomes larger and the decrease amount of the drain-source current $I_{ds}$ becomes large.

Thus, by applying the negative feedback to the gate-source voltage $V_{gs}$ with the feedback amount $\Delta V$ corresponding to the drain-source current $I_{ds}$ of the driving transistor 22, the current values of the drain-source current $I_{ds}$ of the pixels with the different mobilities μ become equal to each other. As a consequence, the variation in the mobility μ between the pixels can be corrected. That is, the process of applying the negative feedback to the gate-source voltage $V_{gs}$ of the driving transistor 22 with the feedback amount $\Delta V$ corresponding to the current (the drain-source current $I_{ds}$) flowing in the driving transistor 22 is the mobility correction process.

Hereinafter, a relationship between the signal voltage $V_{sig}$ of the video signal and the drain-source current $I_{ds}$ of the driving transistor 22 according to whether the threshold value correction and the mobility correction are performed on the pixel (pixel circuit) 20 shown in FIG. 2 will be described with reference to FIGS. 9A to 9C.

Figure 9A:
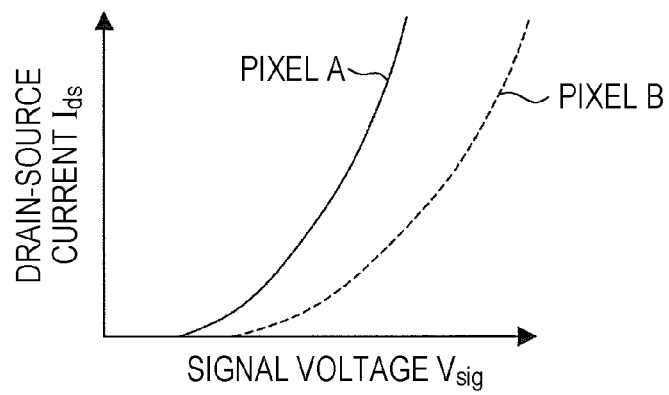
FIGS. 9A and 9C are diagrams illustrating characteristics of a relationship between a signal voltage $V_{sig}$ of a video signal and a drain-source current $I_{ds}$ of the driving transistor according to whether threshold value correction and mobility correction are performed.

In FIG. 9A, neither the threshold value correction nor the mobility correction is performed. In FIG. 9B, the mobility correction is not performed and only the threshold value correction is performed. In FIG. 9C, both the threshold value correction and the mobility correction are performed. When neither the threshold value correction nor the mobility correction is performed, as shown in FIG. 9A, there is a large difference in the drain-source current $I_{ds}$ between the pixels A and B due to the variation in the threshold value voltage $V_{th}$ and the mobility μ between the pixels A and B.

Figure 9B:
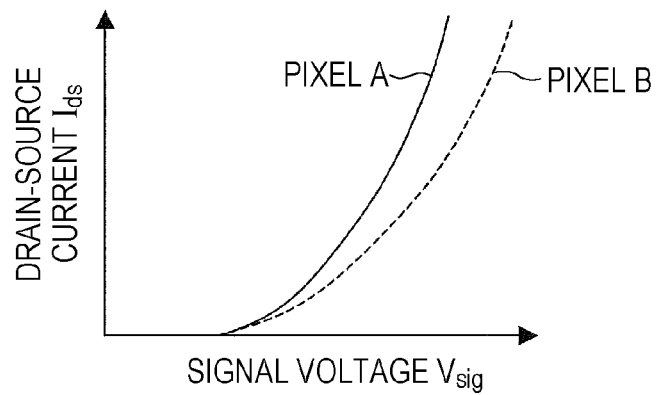
Figure 9C:
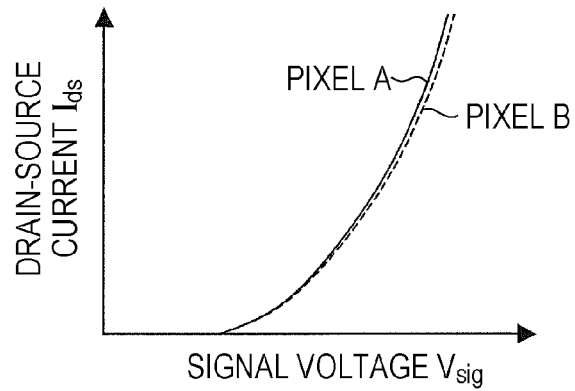

On the other hand, when only the threshold value correction is performed, as shown in FIG. 9B, the variation in the drain-source current $I_{ds}$ can be reduced to some extent, but the difference in the drain-source current $I_{ds}$ between the pixels A and B caused due to the variation in the mobility μ between the pixels A and B remains. On the other hand, when both the threshold value correction and the mobility correction are performed, as shown in FIG. 9C, the difference in the drain-source current $I_{ds}$ between the pixels A and B caused due to the threshold value voltage $V_{th}$ and the variation in the mobility μ between the pixels A and B is lost. Accordingly, a variation in luminance of the organic EL element 21 does not occur in any gray scale, and a high-quality display image can be obtained.

Since the pixel 20 shown in FIG. 2 has a function of the bootstrap operation of the above-described holding capacitor 24 in addition to the threshold value correction and the mobility correction, the following operational advantages can be obtained.

That is, even when the source potential $V_s$ of the driving transistor 22 is varied with the temporal change in the I-V characteristic of the organic EL element 21, the gate-source potential $V_{gs}$ of the driving transistor 22 can be constantly maintained by the bootstrap operation of the holding capacitor 24. Therefore, the current flowing in the organic EL element 21 is not changed and becomes constant. As a consequence, since the light emission luminance of the organic EL element 21 is also constantly maintained, an image display with no luminance deterioration can be realized in spite of the temporal change in the I-V characteristic of the organic EL element 21.

1-3. Bootstrap Operation

Hereinafter, the above-described bootstrap operation will be described in detail with reference to the timing waveform diagram of FIG. 10.

As apparent from the above description of the circuit operation, the signal voltage $V_{sig}$ of the video signal is written into the gate electrode of the driving transistor 22 when the period in which the signal writing and the mobility correction end. At this time, the source potential $V_s$ of the driving transistor 22 is a potential $V_{s1}$ ($V_{ofs}-V_{th}+\Delta V_s$) increased by only the increase amount $\Delta V_s$ of the potential corresponding to the mobility µ from the time at which the threshold value correction process ends.

Here, when the writing transistor 23 enters the non-conductive state, the gate-source voltage $V_{gs}$ of the driving transistor 22 is held in the holding capacitor 24. Therefore, the source potential $V_s$ increases up to a potential $V_{oled}$ corresponding to the current $I_{ds}$ flowing in the driving transistor 22. At this time, the ideal increase mount is equal to an increase amount $V_{oled}-V_{s1}$ of the source potential $V_s$. However, when there are parasitic capacitances in the driving transistor 22 and the writing transistor 23, the increase amount is smaller than an increase amount of the source potential $V_s$.

Bootstrap Gain $G_b$

Figure 11:
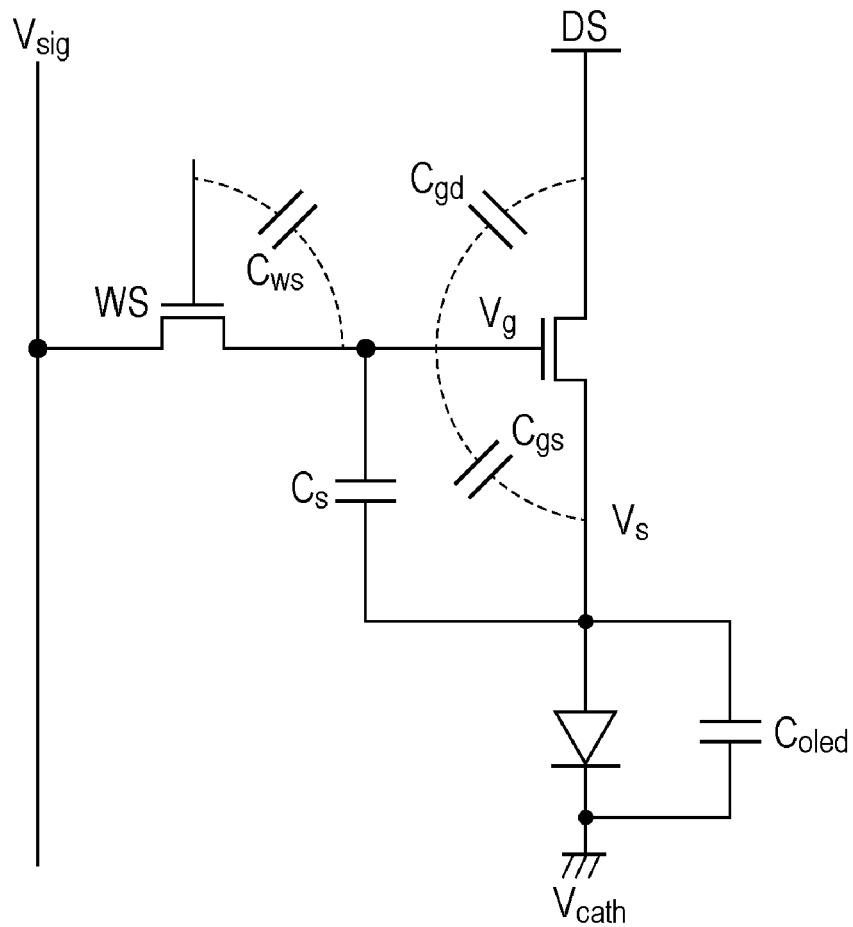
FIG. 11 is a diagram illustrating a bootstrap gain $G_b$.

As shown in FIG. 11, there are parasitic capacitances $C_{gs}$, $C_{gd}$, and $C_{ws}$ in the driving transistor 22 and the writing transistor 23. The parasitic capacitance $C_{gs}$ is a parasitic capacitance between the gate and the source of the driving transistor 22. The parasitic capacitance $C_{gd}$ is a parasitic capacitance between the gate and the drain of the driving transistor 22. The parasitic capacitance $C_{ws}$ is a parasitic capacitance between the gate and the drain of the writing transistor 23.

Here, it is assumed that the gate potential $V_g$ and the source potential $V_s$ before the bootstrap operation of the driving transistor 22 are $V_{g1}$ and $V_{s1}$, respectively, and the gate potential $V_g$ and the source potential $V_s$ after the bootstrap operation are $V_{g2}$ and $V_{s2}$, respectively.

When the source potential $V_s$ of the driving transistor 22 increases from the potential $V_{s1}$ to the potential $V_{s2}$, the gate potential $V_g$ increases only by a value $(C_s+C_{gs})/(C_s+C_{gs}+C_{gd}+C_{ws})\times(V_{s2}-V_{s1})$. At this time, the coefficient, that is, $(C_s+C_{gs})/(C_s+C_{gs}+C_{gd}+C_{ws})$ is the bootstrap gain $G_b$ and the bootstrap gain $G_b$ is necessarily 1 or less. Accordingly, the increase amount $\Delta V$, of the gate potential $V_g$ becomes smaller than the increase amount $\Delta V_g$ of the source potential $V_s$.

Thus, when there are parasitic capacitances in the driving transistor 22 and the writing transistor 23, the increase amount $\Delta V_g$ of the gate potential $V_g$ becomes smaller than the increase amount $\Delta V_s$ of the source potential $V_s$. As a consequence, the gate-source voltage $V_{gs}$ of the driving transistor 22 becomes smaller than the gate-source voltage $V_{gs}$ by the bootstrap operation when the mobility correction process is completed. Accordingly, when the parasitic capacitance inherent in the gate electrode of the driving transistor 22 is large and the bootstrap gain $G_b$ is small, a problem may arise in that desired light emission luminance is not obtained.

Reoccurrence of Variation in Threshold Value Voltage $V_{th}$

Figure 12:
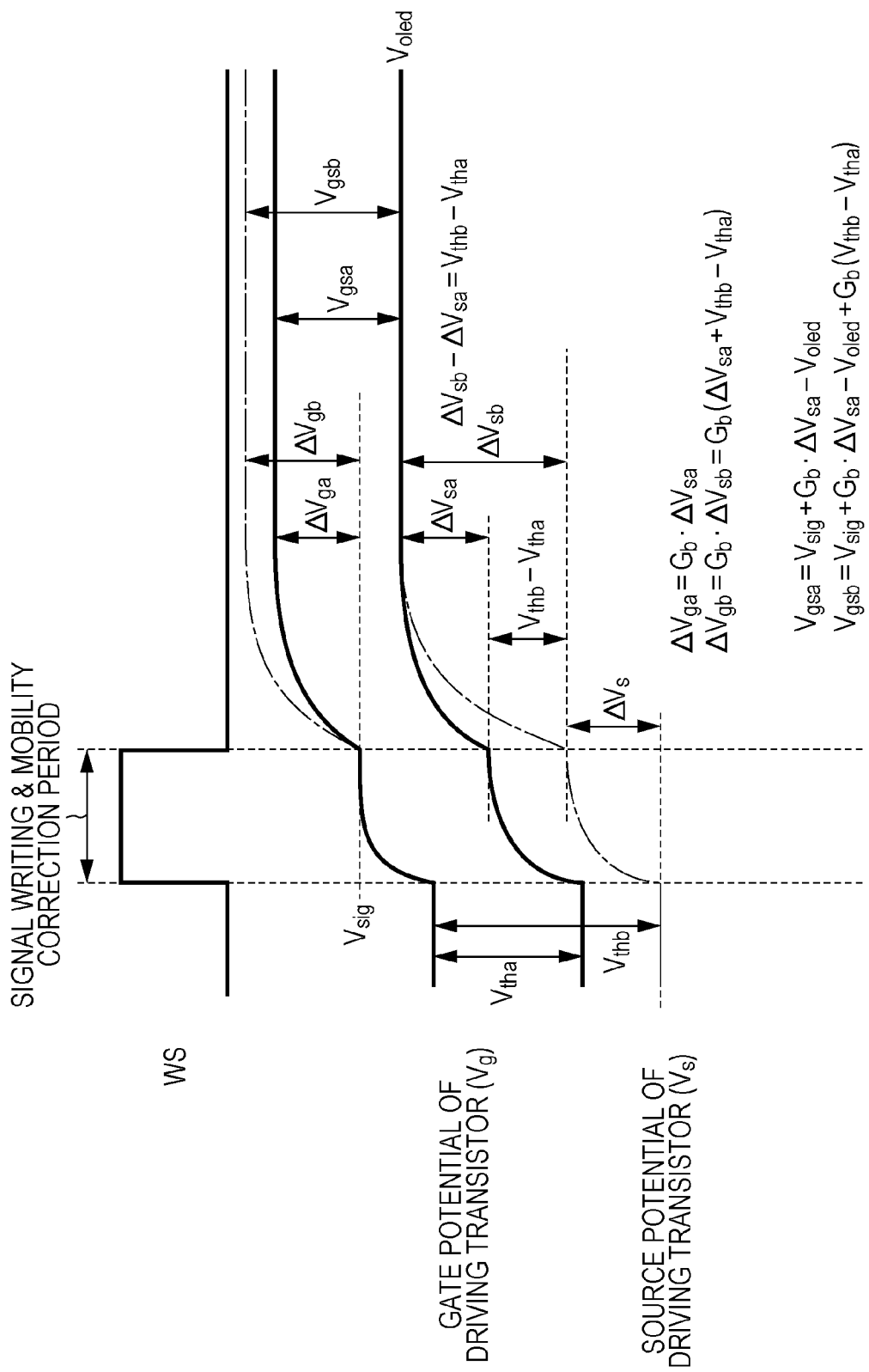
FIG. 12 is a diagram illustrating a timing waveform to describe reoccurrence of a variation in the threshold value voltage $V_{th}$.

As shown in FIG. 12, it is considered that there may be a different case within the threshold value voltages $V_{th}$ of the driving transistor 22 where $V_{tha}$ and $V_{thb}$ are included. When the threshold value correction operation is completed, a difference in the gate-source voltage $V_{gs}$ between the transistor with $V_{tha}$ of the threshold value voltages $V_{th}$ and the transistor with $V_{thb}$ the threshold value voltages $V_{th}$ is $V_{thb}-V_{tha}$. Since the increase amount $\Delta V_s$ of the source potential $V_s$ does not depend on the threshold value voltage $V_{th}$ in the mobility correction operation either, the difference in the gate-source voltage $V_{gs}$ is maintained with $V_{thb}-V_{tha}$.

In the bootstrap operation, the source potential $V_s$ increases up to the voltage $V_{oled}$ determined by the current $I_{ds}$ of the driving transistor 22. Therefore, the increase amount $\Delta V_{sa}$ and the increase amount $\Delta V_{sb}$ of the source potential $V_s$ are different from each other only by the difference $V_{thb}-V_{tha}$ of the threshold value voltage $V_{th}$. At this time, the increase amount $\Delta V_g$ of the gate potential $V_g$ is determined by the increase amount $\Delta V$, of the source potential $V_s$.

Therefore, as shown in FIG. 12, the difference in the gate-source voltage $V_{gs}$ after the bootstrap operation is a value $(C_s+C_{gs})(C_s+C_{gs}+C_{gd}+C_{ws})\times(V_{thb}-V_{tha})$, and thus becomes smaller than that after the threshold value correction. Accordingly, the variation in the threshold value voltage $V_{th}$ occurs irrespective of the fact that the threshold value correction process is performed. When the parasitic capacitance is large, this variation amount is large, thereby causing luminance irregularity.

Voltage Increase in Voltage $V_{oled}$ of Organic EL Element 21

Figure 13:
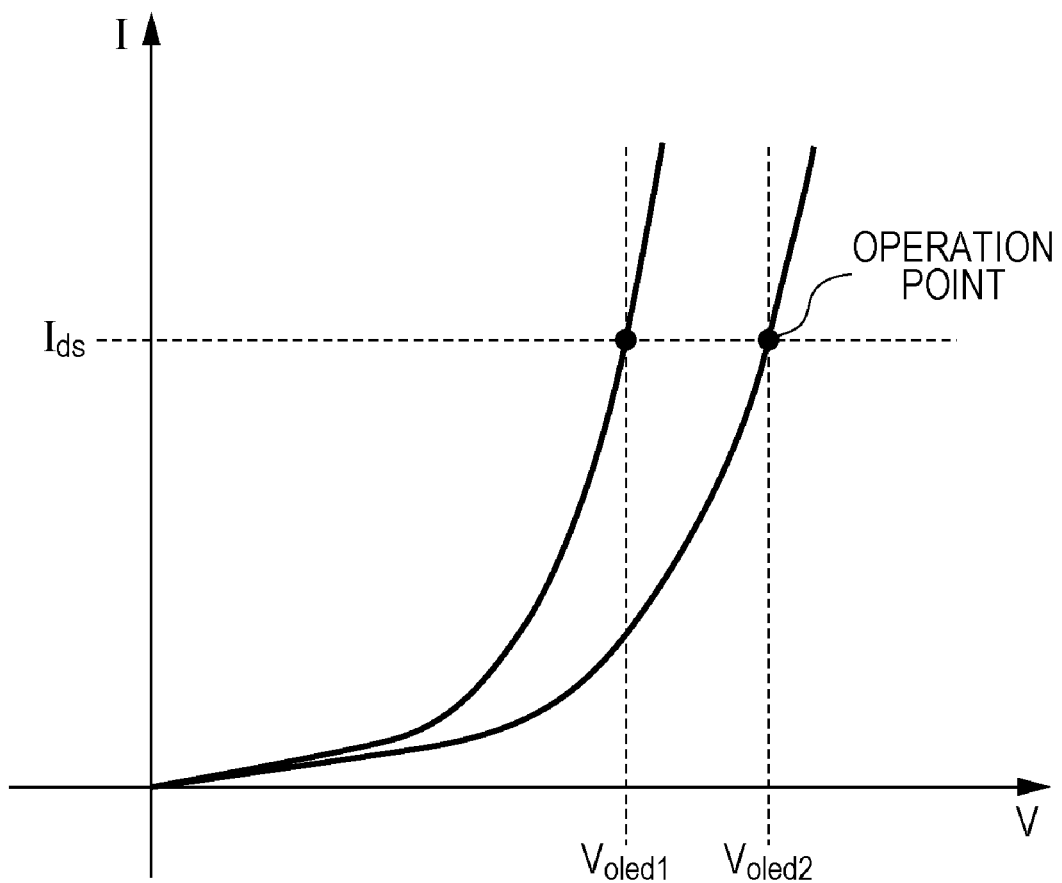
FIG. 13 is a diagram illustrating an operation point of an organic EL element shifted when the organic EL element deteriorates.

When the organic EL element 21 deteriorates, as shown in FIG. 13, an operation point of the organic EL element 21 is shifted from a voltage $V_{oled1}$ to a voltage $V_{oled2}$, that is, the voltage increases. Here, a voltage increase in the voltage $V_{oled}$ of the organic EL element 21 is considered.

In a pixel in which the organic EL element 21 does not deteriorate, the increase amount of the source potential $V_s$ is $\Delta V_{sa}$ in the bootstrap operation. On the contrary, in a pixel in which the organic EL element 21 deteriorates, the increase amount $\Delta V_{sb}$ of the source potential $V_s$ is a value $\Delta V_{sa}+V_{oled2}-V_{oled1}$. Accordingly, the increase amount $\Delta V_g$ of the gate potential $V_g$ is shown in FIG. 14 and the gate-source voltage $V_{gs}$ of the driving transistor 22 decreases by only a value $(C_s+C_{gs})/(C_s+C_{gs}+C_{gd}+C_{ws})\times(V_{oled2}-V_{oled1})$. As a consequence, when the parasitic capacitance is large, the decrease amount of the gate-source voltage $V_{gs}$ is also large. That is, since the current $I_{ds}$ of the driving transistor 22 decreases, image sticking may be caused.

Configuration of Driving Transistor According to Related Art

FIGS. 15A and 15B are plan and sectional views illustrating a driving transistor according to the related art. In FIGS. 15A and 15B, the same reference numerals are given to the same constituent elements as those of FIG. 3.

A driving transistor $22_A$ according to the related art is, for example, a bottom gate type transistor that uses an LDD (Lightly Doped Drain) configuration. Specifically, in the driving transistor $22_A$, the gate electrode 221 is disposed closer to the substrate than a channel region (corresponding to a channel formation region in FIG. 3) 225. Low-concentration impurity regions, that is, LDD regions 226 and 227 are formed between the channel region 225 and the source/drain regions 223 and 224, respectively.

In the driving transistor $22_A$, a metal wiring 229 is electrically connected to one source/drain region 224 via a contact portion 228. In order to shield light, a shield configuration is used in which the metal wiring 229 extends up to above the channel region 225 to cover above channel region 225.

In the driving transistor $22_A$ with the above-described configuration according to the related art, the LDD regions 226 and 227 are formed so as to overlap with the gate electrode 221. Therefore, capacitances are formed between the gate electrode 221 and the LDD regions 226 and 227, respectively, so that the parasitic capacitances of the driving transistor $22_A$ occur. These parasitic capacitances become the parasitic capacitance $C_{gd}$ between the source and drain of the driving transistor 22 described above and the parasitic capacitance $C_{gs}$ between the gate and source of the driving transistor 22. Moreover, when the capacitance value of the parasitic capacitance $C_{gd}$ between the gate and the drain of the driving transistor 22 is large, the deterioration in the bootstrap gain $G_b$ is caused.

Here, the reason for forming the LDD regions 226 and 227 so as to overlap with the gate electrode 221 is as follows.

That is, in order to form the LDD regions 226 and 227, the gate electrode 221 is first exposed from the rear surface as a mask. Next, the LDD regions 226 and 227 are formed by performing patterning and then implanting impurities. At this time, since a pattern exposed from the rear surface and formed is subjected to light seepage, heat treatment, or the like subsequently, the pattern becomes slimmer than the wiring of the gate electrode 221. Accordingly, the LDD regions 226 and 227 necessarily overlap with the gate electrode 221, that is, the LDD regions 226 and 227 are formed in a region facing the gate electrode 221.

Here, the case of the bottom gate type transistor, for example, the reason for forming the LDD regions 226 and 227 so as to overlap with the gate electrode 221 has been described, but the invention is not limited to the bottom gate type transistor. That is, when the LDD regions 226 and 227 are formed so as to overlap with the gate electrode 221, a top gate type transistor may be used in which the gate electrode 221 is disposed in the opposite to side to the substrate of the channel region 225.

2. Organic EL Apparatus According to Embodiment

The organic EL apparatus according to this embodiment has the configuration of the driving transistor 22 of the pixels in the system configuration shown in FIG. 1. Hereinafter, the specific configuration of the driving transistor 22 will be described.

A driving transistor $22_B$ according to this embodiment is a bottom gate type transistor in which the gate electrode is formed closer to the substrate than the channel region. The driving transistor $22_B$ has an LDD configuration in which impurity regions with lower concentration than that of source/drain regions, that is, the LDD region, are formed between the channel region and a first source/drain region closer to the power source and a second source/drain region closer to an electro-optic element so that a high electric field is not focused on the LDD region.

When the LDD region and the gate electrode face each other in the driving transistor $22_B$ having the LDD configuration, parasitic capacitances are formed in the facing portions. As described above, the capacitance value of the parasitic capacitance inherent in the gate electrode of the driving transistor $22_B$ is one of the parameters determining the bootstrap gain $G_b$.

The LDD region located between the channel region and the first source/drain region closer to the power source is formed in a region other than a region facing the gate electrode. Thus, since it is possible to reduce the capacitance value of the parasitic capacitance formed between the gate electrode and the LDD region closer to the power source, that is, the capacitance value of the parasitic capacitance between the gate and the drain of the driving transistor $22_B$, the bootstrap gain $G_b$ can be improved. As a consequence, a high-quality display image can be obtained without damage to the uniformity of a screen.

On the other hand, a part of the LDD region located between the channel region and the second source/drain region closer to the electro-optic element is formed in a region facing the gate electrode. At this time, the parasitic capacitance is formed between the LDD region closer to the electro-optic element and the gate electrode, but the parasitic capacitance is operated so that the bootstrap gain $G_b$ is increased. Moreover, since the LDD configuration closer to the electro-optic element (the organic EL element 21) is the configuration according to the related art, the deterioration in the characteristic of the driving transistor $22_B$ caused due to the asymmetric LDD configuration with respect to the channel region 225 can be suppressed so as to be as small as possible.

Embodiment

Configuration of Driving Transistor

A specific embodiment of the driving transistor $22_B$ will be described with reference to FIGS. 16A and 16B. FIGS. 16A and 16B are diagrams illustrating the configuration of the driving transistor $22_B$ according to the embodiment. FIGS. 16A and 16B are a plan view and a sectional view illustrating the driving transistor $22_B$, respectively. The reference numerals are given to the same constituent elements as those of FIGS. 15A and 15B.

As shown in FIGS. 16A and 16B, the driving transistor $22_B$ according to the embodiment is a bottom gate type transistor in which the gate electrode 221 is formed closer to the substrate than the channel region (channel formation region) 225. In addition, the driving transistor $22_B$ according to the embodiment has the LDD configuration in which the impurity regions with lower concentration than that of the source/drain regions 223 and 224, that is, the LDD regions 226 and 227, are formed between the channel region 225 and the source/drain regions 223 and 224, respectively.

In the driving transistor $22_B$ with the LDD configuration according to the embodiment, the LDD region 226 closer to the power source, that is, the LDD region 226 located between the channel region 225 and the source/drain region 223 closer to the power source is formed in a region other than the region facing the gate electrode 221. On the other hand, a part of the LDD region 227 closer to the organic EL element, that is, a part of the LDD region 227 located between the channel region 225 and the source/drain region 224 closer to the organic EL element, is formed in the region facing the gate electrode 221. That is, the LDD regions 226 and 227 have an asymmetric LDD configuration with respect to the channel region 225.

In the driving transistor $22_B$ according to the embodiment, the metal wiring 229 is electrically connected to the source/drain region 224 closer to the organic EL element 21 via the contact portion 228. In the driving transistor $22_B$, the shielding configuration in which the metal wiring 229 extends up to above the channel region 225 to cover the channel region 225 is used in order to shield light.

In the driving transistor $22_B$, as described above, the LDD region 226 closer to the power source is formed in the region other than the region facing the gate electrode 221. Therefore, the capacitance value of the parasitic capacitance formed between the gate electrode 221 and the LDD region 226 can be reduced. The parasitic capacitance formed between the gate electrode 221 and the LDD region 226 is a parasitic capacitance formed between the gate and the drain of the driving transistor $22_B$.

As described above, the bootstrap gain $G_b$ is determined by the total capacitance of the parasitic capacitance inherent in the gate electrode of the driving transistor 22. Specifically, the bootstrap gain $G_b$ is given as a value $(C_s+C_{gs})/(C_s+C_{gs}+C_{gd}+C_{ws})$. Here, $C_s$ is a capacitance value of the holding capacitor 24, $C_{gs}$ is a capacitance value of the parasitic capacitance between the gate and the source of the driving transistor 22, $C_{gd}$ is a capacitance value of the parasitic capacitance between the gate and drain of the driving transistor 22, and $C_{ws}$ is a capacitance value of the parasitic capacitance between the gate and the drain of the writing transistor 23.

As apparent from the above expression, the bootstrap gain $G_b$ becomes large when the capacitance value $C_{gd}$ of the parasitic capacitance between the gate and the drain of the driving transistor $22_B$ is small. Accordingly, the bootstrap gain $G_b$ can be improved by forming the LDD region 226 closer to the power source in the region other than the region facing the gate electrode 221 and reducing the capacitance value $C_{gd}$ of the parasitic capacitance between the gate and the drain of the driving transistor $22_B$. As a consequence, the high-quality display image can be obtained without damage to the uniformity of a screen.

On the other hand, since the LDD region 227 closer to the organic EL element has the same configuration as that of the related art, that is, the configuration in which a part of the LDD region 227 is located in the region facing the gate electrode 221, the parasitic capacitance is formed between the gate electrode 221 and the LDD region 227, as in the related art. The parasitic capacitance formed between the gate electrode 221 and the LDD region 227 is a parasitic capacitance formed between the gate and the source of the driving transistor $22_B$ and operated so that the bootstrap gain $G_b$ is increased, as apparent from the above expression.

Figure 17:
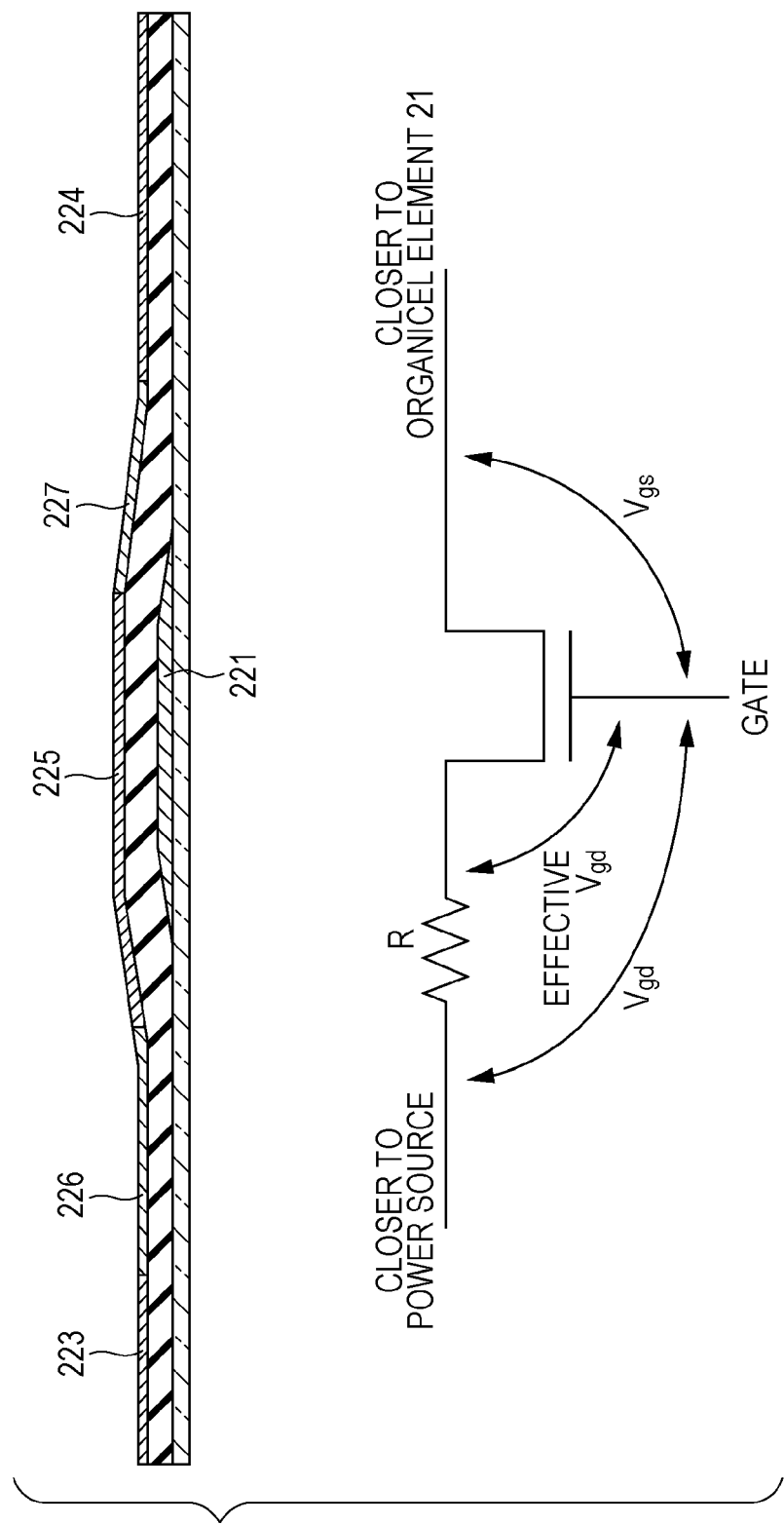
FIG. 17 is a diagram illustrating the equivalent circuit of the driving transistor according to the embodiment.

In the driving transistor $22_B$ according to the embodiment, the LDD region 226 is located in the region other than the region facing the gate electrode 221. As shown in FIG. 17, a configuration is formed in which a resistance component R is attached on the side closer to the power source, that is, the side closer to the source/drain region 223. However, the LDD configuration closer to the organic EL element 21 is the same as that of the related art and the driving transistor $22_B$ operates in the saturation region. Therefore, even when an effective gate-source voltage $V_{gs}$ decreases, the current $I_{ds}$ flowing in the driving transistor $22_B$ is not influenced by the decrease in the gate-source voltage $V_{gs}$.

Although the characteristics of the driving transistor $22_B$ slightly deteriorate in the asymmetric LDD configuration in which the LDD region 226 and the LDD region 227 is asymmetric with respect to the channel region 225, the circuit operation is not influenced by the deterioration in the characteristics. In other words, although the characteristics of the driving transistor $22_B$ slightly deteriorate due to the fact that the LDD region 226 closer to the power source is located in the region other than the region facing the gate electrode 221, it is possible to obtain the operation and advantage from the decrease in the capacitance value $C_{gd}$ of the parasitic capacitance between the gate and drain of the driving transistor $22_B$.

Method of Manufacturing Driving Transistor

Figure 18:
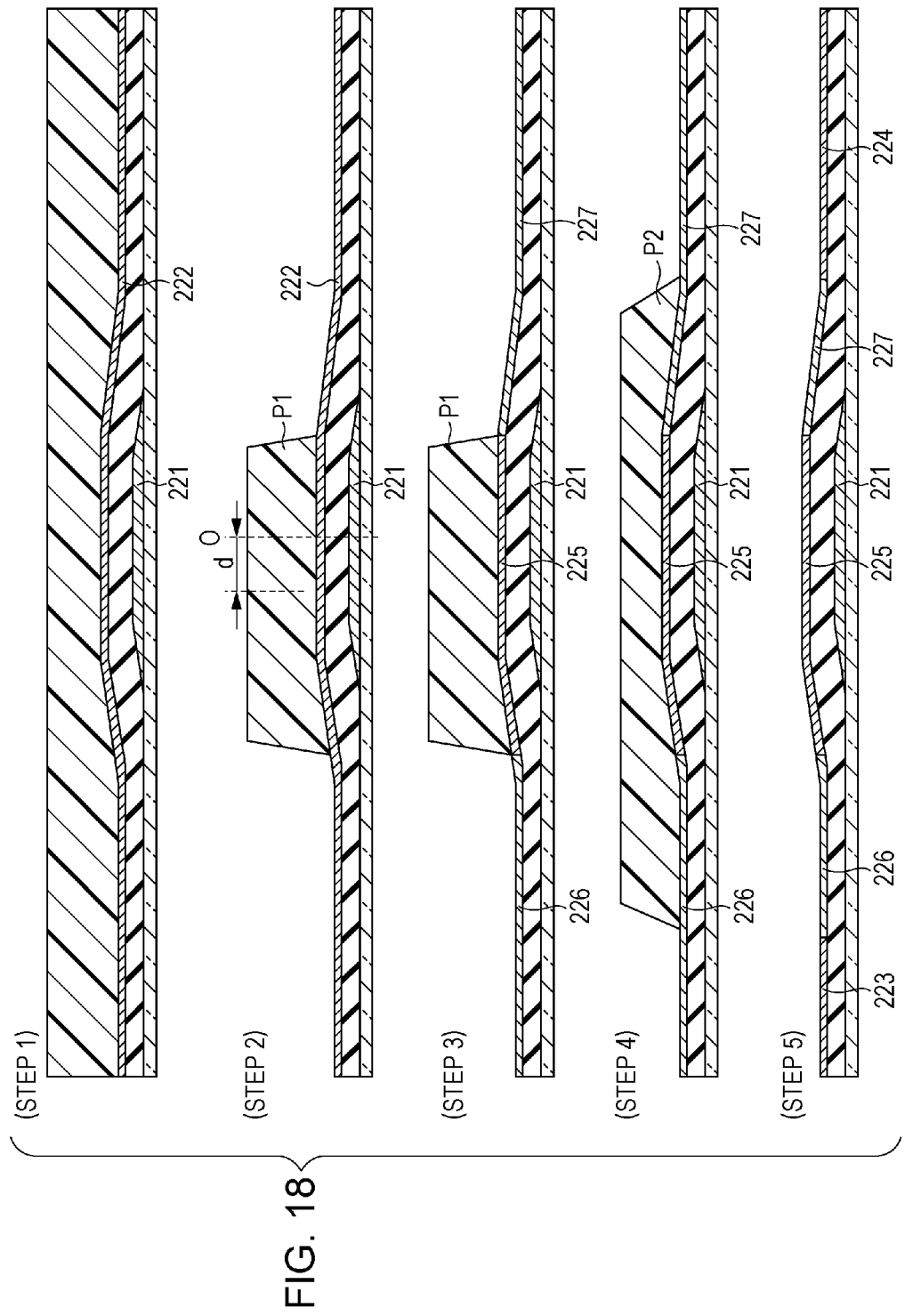
FIG. 18 is a diagram illustrating an example of a method of manufacturing the driving transistor according to the embodiment.

Next, a method of manufacturing the driving transistor $22_B$ according to the embodiment will be described with reference to the process drawing of FIG. 18.

First, the gate electrode 221 and the semiconductor layer 222 are formed (step 1), and then a photoresist P1 is formed in a state where the photoresist P1 is shifted toward the power source by a predetermined amount d from a center O of the gate electrode 221 (step 2). Next, patterning is performed in the outer side of the gate electrode 221 by exposure from the front surface of the substrate using the photoresist P1 as a mask, and then the LDD regions 226 and 227 are formed by implanting impurities (step 3). Here, the predetermined amount d is set as a value by which the LDD region 226 closer to the power source is formed in the region other than the region facing the gate electrode 221.

Subsequently, a photoresist P2 is formed to form the source/drain regions 223 and 224 (step 4). Next, the patterns of the source/drain regions 223 and 224 are formed by exposure from the front surface of the substrate using the photoresist P2 as a mask, and then the source/drain regions 223 and 224 are formed by implanting impurities (step 5).

As described above, the gate electrode 221 and the semiconductor layer 222 are formed and then the photoresist P1 is formed in the state where the photoresist P1 is shifted closer to the power source with reference to the center O of the gate electrode 221. Then, the patterning is performed by exposure from the front surface of the substrate using the photoresist P1 as a mask, and then the LDD regions 226 and 227 are formed by implanting the impurities. By forming the LDD regions 226 and 227 by this manufacturing process, the LDD region 226 closer to the power source can be formed in the region other than the region facing the gate electrode 221.

3. Modified Examples

In the above-described embodiment, the driving transistor 22 has been described as the bottom gate type transistor. The embodiment of the invention is applicable to a top gate type transistor in which the gate electrode is disposed opposite to the substrate with respect to the channel region.

In the above-described embodiment, the organic EL element 21 has been described which has the pixel configuration basically including two transistors of the driving transistor 22 and the writing transistor 23. The embodiment of the invention is not limited to this pixel configuration. That is, the embodiment of the invention is applicable to a general display apparatus having the writing transistor 23 in which a pixel includes a plurality of gates.

In the above-described embodiment, the organic EL display apparatus has been described which uses the organic EL element as the electro-optic element of the pixel 20, but the embodiment of the invention is not limited to this applied example. Specifically, the embodiment of the invention is applicable to a general display apparatus which uses a current-driven-type electro-optic element (light-emitting element), such as an inorganic EL element, an LED element, or a semiconductor laser element, in which light emission luminance varies according to the value of a current flowing in a device.

4. Applied Examples

The above-described embodiment display apparatus according to the embodiment of the invention is applicable to display apparatuses of electronic apparatuses in all fields which are capable of displaying a video signal input to the electronic apparatuses or a video signal generated in the electronic apparatuses as an image or a video. For example, the above-described display apparatus is applicable to display apparatuses of various electronic apparatuses shown in FIGS. 19 to 23G, for example, portable terminal apparatuses such as a digital camera, a laptop personal computer, a cellular phone and a video camera.

By using the display apparatus according to the embodiment of the invention as the display apparatuses of electronic apparatuses in all fields, the image quality of the display image can be improved in various electronic apparatuses. That is, as apparent from the above description of the embodiment, the image quality of the display image can be improved since the display apparatus according to the embodiment of the invention can obtain a high-quality display image without damage to the uniformity of a screen by improving the bootstrap gain $G_b$.

The display apparatus according to the embodiment of the invention includes a module form with a sealed configuration. For example, a display module formed by attaching a facing portion such as transparent glass to the pixel array unit 30 is included. A color filter, a protective film, or the above-described light-shielding film may be disposed on the transparent facing portion. In a display module, a circuit unit, an FPC (flexible printed circuit), or the like may be disposed to input and output a signal or the like from the outside to the pixel array unit.

Hereinafter, specific examples of electronic apparatuses to which the embodiment of the invention is applicable will be described.

Figure 19:
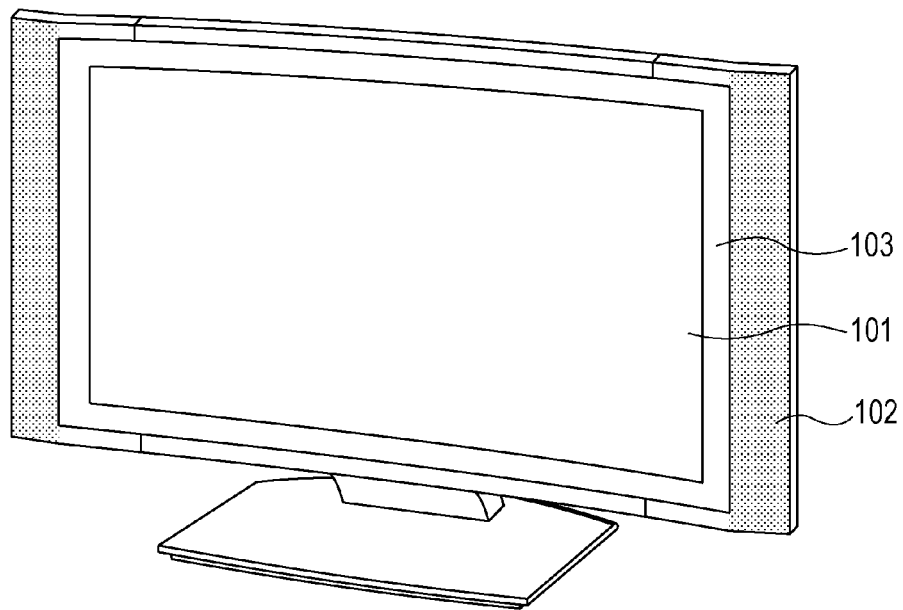
FIG. 19 is a perspective diagram illustrating the outer appearance of a television set according to an embodiment of the invention.

FIG. 19 is a perspective view illustrating the outer appearance of a television set to which the embodiment of the invention is applied. The television set according to this applied example includes a video display screen unit 101 including a front panel 102 or a filter glass 103. The display apparatus according to the embodiment of the invention is used as the video display screen unit 101.

Figure 20A:
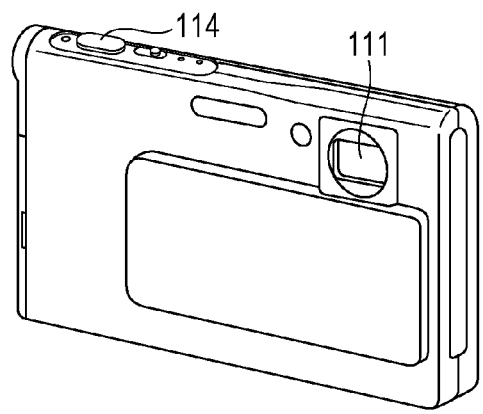
FIGS. 20A and 20B are perspective diagrams illustrating the outer appearance of a digital camera when viewed from the front and rear sides, respectively.
Figure 20B:
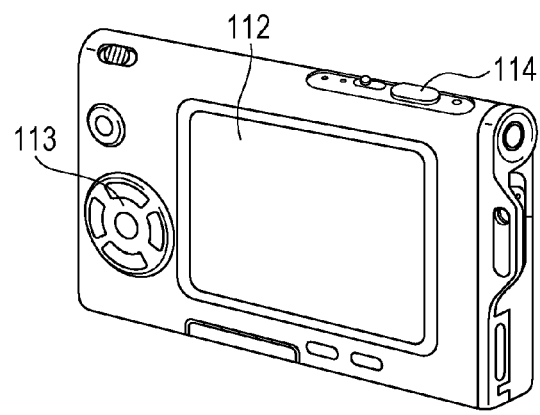

FIGS. 20A and 20B are perspective views illustrating the outer appearance of a digital camera according to an embodiment of the invention when viewed from the front side and rear side, respectively. The digital camera according to this applied example includes a light-emitting unit 111 used for a flash, a display unit 112, a menu switch 113, and a shutter button 114 and is manufacturing by using the display apparatus according to the embodiment of the invention as the display unit 112.

Figure 21:
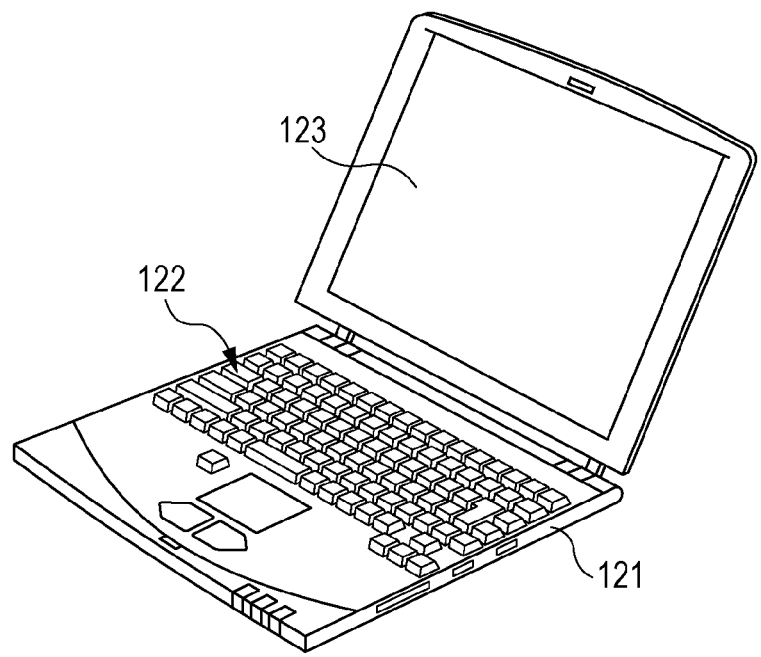
FIG. 21 is a perspective view illustrating the outer appearance of a laptop personal computer according to an embodiment of the invention.

FIG. 21 is a perspective view illustrating the outer appearance of a laptop personal computer according to an embodiment of the invention. The laptop personal computer according this applied example includes a main body 121, a keyboard 122 operated when characters or the like are input, and a display unit 123 displaying an image and is manufactured by using the display apparatus according to the embodiment of the invention as the display unit 123.

Figure 22:
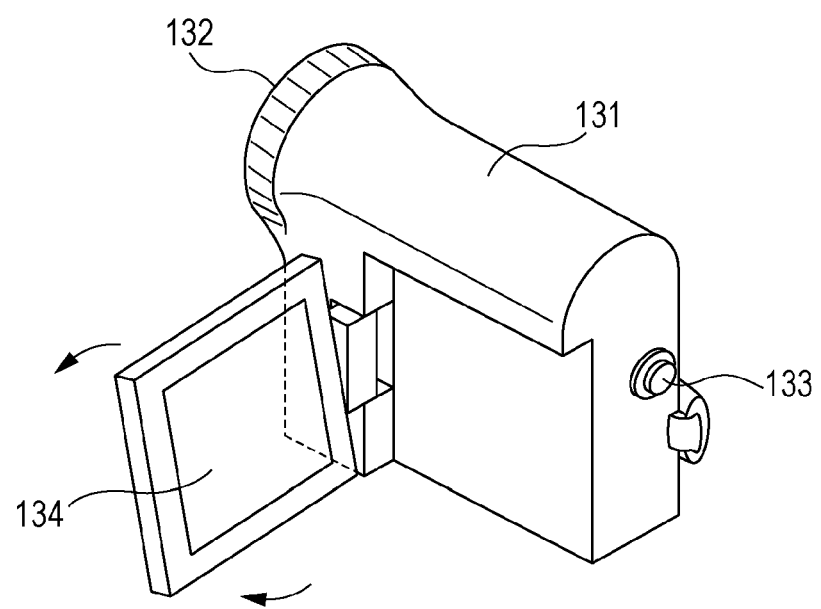
FIG. 22 is a perspective view illustrating the outer appearance of a video camera according to an embodiment of the invention.

FIG. 22 is a perspective view illustrating the outer appearance of a video camera according to an embodiment of the invention. The video camera according to this applied example includes a main body unit 131, a subject imaging lens 132 on the side surface facing the front side, a start/stop switch 133 used to take a photograph, and a display unit 134 and is manufactured by using the display apparatus according to the embodiment of the invention as the display unit 134.

FIGS. 23A to 23G are diagrams illustrating the outer appearance of a portable terminal apparatus according to an embodiment of the invention. For example, FIG. 23A is a front view illustrating an opened cellular phone, FIG. 23B is a side view illustrating the opened cellular phone, FIG. 23C is a front view illustrating the closed cellular phone, FIG. 23D is a left front view illustrating the closed cellular phone, FIG. 23E is a right front view illustrating the closed cellular phone, FIG. 23F is a diagram illustrating the upper surface of the closed cellular phone, and FIG. 23G is a diagram illustrating the lower surface of the closed cellular phone. The cellular phone according to this applied example includes an upper case 141, a lower case 142, a connection unit (herein, a hinge unit) 143, a display 144, a sub-display 145, a picture light 146, and a camera 147. The cellular phone according to this applied example is manufactured by using the display apparatus according to the embodiment of the invention as the display 144 or the sub-display 145.

The present application contains subject matter related to that disclosed in Japanese Priority Patent Application JP 2010-079014 filed in the Japan Patent Office on Mar. 30, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display apparatus comprising a plurality of pixels each pixel including an electro-optic element, a writing transistor to write a video signal into the pixel, a holding capacitor to hold the video signal written by the writing transistor, and a driving transistor to drive the electro-optic element based at least in part on the video signal held in the holding capacitor, wherein the driving transistor includes:

a channel region,
a gate electrode disposed opposite to the channel region,
a first source/drain region closer to a power source,
a second source/drain region closer to the electro-optic element, and
impurity regions disposed between the channel region and the first and second source/drain regions and having a lower concentration than that of the corresponding source/drain regions, and
wherein the impurity region disposed between the channel region and the first source/drain region is formed in a region other than a region facing the gate electrode;
wherein a part of the impurity region disposed between the channel region and the second source/drain region is formed in a region facing the gate electrode.

2. The display apparatus according to claim 1, wherein the driving transistor is a bottom gate type transistor in which the gate electrode is disposed closer to a substrate than the channel region.

3. The display apparatus according to claim 2,
wherein there is a parasitic capacitance between the gate electrode and the impurity region disposed between the channel region and the second source/drain region, and
wherein a capacitance value of the parasitic capacitance is one of multiple parameters used to determine a gain in a bootstrap operation in which a gate potential is varied on a track of a source potential of the driving transistor when the writing transistor is in a non-conductive state.

4. The display apparatus according to claim 3, wherein the source potential of the driving transistor is varied according to a current flowing in the driving transistor.

* * * * *